US012631953B2

(12) United States Patent
Han

(10) Patent No.: US 12,631,953 B2
(45) Date of Patent: May 19, 2026

(54) METHODS FOR OPTICAL PROXIMITY CORRECTION AND METHODS OF FABRICATING SEMICONDUCTOR DEVICES USING THE SAME

(71) Applicant: Samsung Electronics Co., Ltd., Suwon-si (KR)

(72) Inventor: Kyu-Bin Han, Incheon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 805 days.

(21) Appl. No.: 17/819,031

(22) Filed: Aug. 11, 2022

(65) Prior Publication Data

US 2023/0194974 A1 Jun. 22, 2023

(30) Foreign Application Priority Data

Dec. 21, 2021 (KR) ........................ 10-2021-0183862

(51) Int. Cl.
*G06F 30/398* (2020.01)
*G03F 1/36* (2012.01)
*G03F 1/70* (2012.01)
*H01L 21/027* (2006.01)

(52) U.S. Cl.
CPC .................. *G03F 1/36* (2013.01); *G03F 1/70* (2013.01); *G06F 30/398* (2020.01); *H01L 21/0274* (2013.01)

(58) Field of Classification Search
CPC ........ G06F 30/398; G06F 30/39; G06F 30/20; G06F 30/367; G06F 30/392; G06F 30/00; G06F 2119/18; G06F 30/27; G03F 7/70441; G03F 1/36; G03F 7/70433; G03F 7/0002; G03F 1/22; G03F 7/70283; G03F 1/20; G03F 1/70; G03F 1/78; G03F 1/44; G03F 1/68; G03F 7/70191
See application file for complete search history.

(56) References Cited

U.S. PATENT DOCUMENTS

| | | | |
|---|---|---|---|
| 7,000,208 B2 | 2/2006 | Zhang | |
| 8,490,034 B1 * | 7/2013 | Torunoglu | .......... G03F 7/70441 |
| | | | 716/55 |
| 8,527,916 B1 | 9/2013 | Chiang et al. | |
| 8,589,830 B2 | 11/2013 | Chang et al. | |
| 8,627,241 B2 | 1/2014 | Wang et al. | |

(Continued)

FOREIGN PATENT DOCUMENTS

| | | |
|---|---|---|
| CN | 113454532 A | 9/2021 |
| KR | 10-2007-0056599 A | 6/2007 |

(Continued)

*Primary Examiner* — Binh C Tat
(74) *Attorney, Agent, or Firm* — Wolf, Greenfield & Sacks, P.C.

(57) ABSTRACT

A method of fabricating a semiconductor device includes performing optical proximity correction (OPC) on a design pattern of a layout and forming a photoresist pattern on a substrate, using a photomask manufactured based on the layout corrected by the OPC. The performing of the OPC includes generating a target pattern for the design pattern, dividing the design pattern into a plurality of segments, modifying the segments to generate a correction pattern, dividing a first segment of the segments into a plurality of sub-segments, and modifying the sub-segments to generate a fine correction pattern.

20 Claims, 22 Drawing Sheets

(56)          References Cited

U.S. PATENT DOCUMENTS

| | | | |
|---|---|---|---|
| 8,751,976 | B2 | 6/2014 | Tsai et al. |
| 9,390,217 | B2 | 7/2016 | Huang et al. |
| 11,048,161 | B2 | 6/2021 | Wang et al. |
| 2012/0072874 | A1 | 3/2012 | Chiang et al. |
| 2019/0004418 | A1* | 1/2019 | Jeong .................. G03F 7/70441 |
| 2020/0342071 | A1* | 10/2020 | Yeo .................. H01L 21/26513 |
| 2021/0072636 | A1 | 3/2021 | Kim et al. |

FOREIGN PATENT DOCUMENTS

| | | | |
|---|---|---|---|
| KR | 100798246 | B1 | 1/2008 |
| KR | 10-2019-0003909 | A | 1/2019 |
| TW | 201823853 | A | 7/2018 |

* cited by examiner

| | |
|---|---|
| ———— | Target |
| - - - - - - | Actual |

METHODS FOR OPTICAL PROXIMITY CORRECTION AND METHODS OF FABRICATING SEMICONDUCTOR DEVICES USING THE SAME

CROSS-REFERENCE TO RELATED APPLICATION(S)

This U.S. non-provisional patent application claims priority under 35 U.S.C. § 119 to Korean Patent Application No. 10-2021-0183862, filed on Dec. 21, 2021, in the Korean Intellectual Property Office, the entire contents of which are hereby incorporated by reference.

BACKGROUND

The present disclosure relates to methods of fabricating semiconductor devices and, in particular, to methods of fabricating semiconductor devices using optical proximity correction (OPC) methods.

Due to their small-size, multifunctional, and/or low-cost characteristics, semiconductor devices are considered important elements in the electronics industry. Semiconductor devices may be classified into a memory device for storing data, a logic device for processing data, and a hybrid device including both of memory and logic elements. As the electronics industry has become more highly developed, demand for semiconductor devices with improved characteristics has increased. For example, demand has increased for semiconductor devices with high reliability, high performance, and/or multiple functions. To address such demand, complexity and/or integration density of semiconductor devices have increased.

SUMMARY

An embodiment of the inventive concept provides an optical proximity correction (OPC) method that can be performed in a highly accurate manner, without violating a mask rule.

An embodiment of the inventive concept provides a method of fabricating a semiconductor device with high integration density and high reliability.

According to an embodiment of the inventive concept, a method of fabricating a semiconductor device may include performing optical proximity correction (OPC) on a design pattern of a layout and forming a photoresist pattern on a substrate, using a photomask manufactured based on the layout corrected by the OPC. The performing of the OPC may include generating a target pattern for the design pattern, dividing the design pattern into a plurality of segments, modifying the segments to generate a correction pattern, dividing a first segment of the segments into a plurality of sub-segments, and modifying the sub-segments to generate a fine correction pattern.

According to an embodiment of the inventive concept, a method of fabricating a semiconductor device may include performing optical proximity correction (OPC) on a design pattern of a layout and forming a photoresist pattern on a substrate, using a photomask manufactured based on the layout corrected by the OPC. The performing of the OPC may include generating a target pattern for the design pattern, dividing the design pattern into a plurality of segments, and generating a fine correction pattern such that a simulation contour of the fine correction pattern conforms to the target pattern. A number of the segments of the fine correction pattern may be increased to a value greater than a number of the segments of the design pattern, during the OPC.

According to an embodiment of the inventive concept, a method of fabricating a semiconductor device may include performing optical proximity correction (OPC) on a design pattern of a layout and forming a photoresist pattern on a substrate, using a photomask manufactured based on the layout corrected by the OPC. The performing of the OPC may include generating a target pattern for the design pattern, dividing the design pattern into a plurality of segments, modifying a first segment of the segments, such that a simulation contour corresponding to the first segment is adjacent to the target pattern, dividing a ripple of the simulation contour into a plurality of pixels, calculating a respective intensity value of light of each of the pixels, selecting adjacent ones of the pixels having a largest difference between the intensity values, and selecting a point between the adjacent ones of the pixels having the largest difference between the intensity values as a dissection point to divide the first segment into a first sub-segment and a second sub-segment.

DETAILED DESCRIPTION

Figure 1:
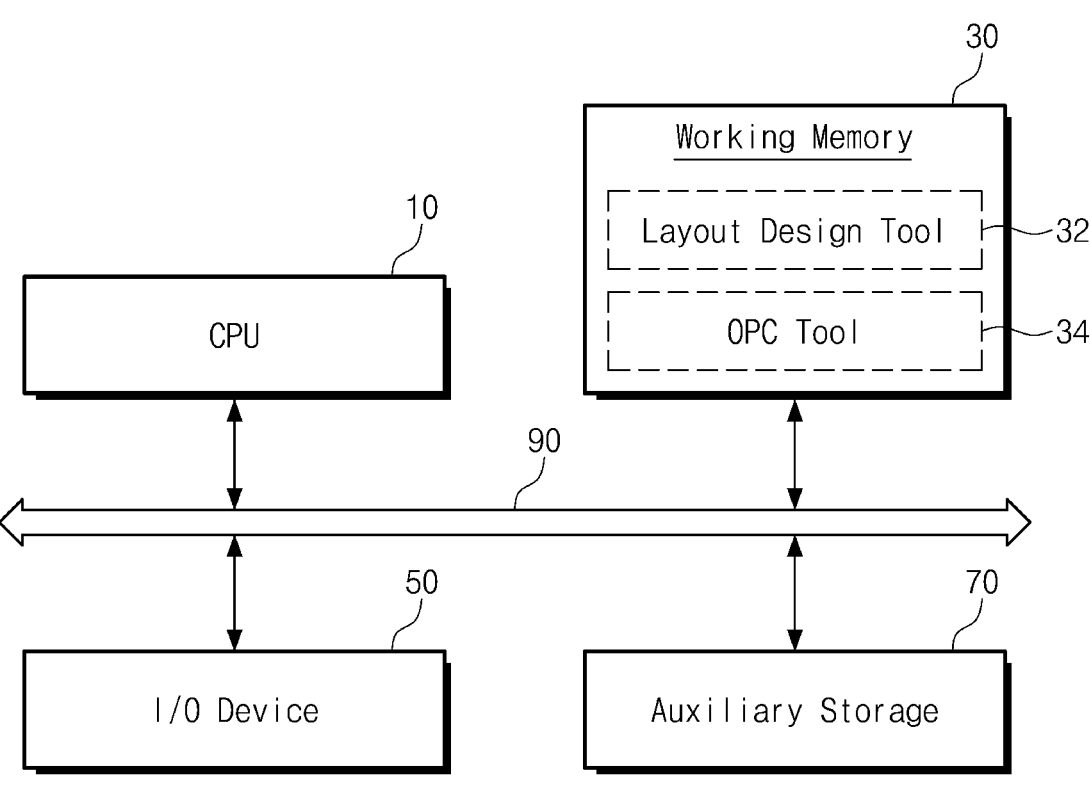
FIG. 1 is a block diagram illustrating a computer system for performing a semiconductor design process, according to an embodiment of the inventive concept.

FIG. 1 is a block diagram illustrating a computer system for performing a semiconductor design process, according to an embodiment of the inventive concept. Referring to FIG. 1, a computer system may include a central processing unit (CPU) 10, a working memory 30, an input/output (I/O) device 50, and an auxiliary storage 70. In an embodiment, the computer system may be a customized system for performing a layout design process according to an embodiment of the inventive concept. Furthermore, the computer system may include a computing system configured to execute various design and check simulation programs.

The CPU 10 may be configured to run a variety of software programs, such as application programs, operating systems, and device drivers. For example, the CPU 10 may be configured to run an operating system (not shown) loaded on the working memory 30. Furthermore, the CPU 10 may be configured to run various application programs on the operating system. For example, the CPU 10 may be configured to run a layout design tool 32 and/or an optical proximity correction (OPC) tool 34 loaded on the working memory 30.

The operating system (OS) or application programs may be loaded on the working memory 30. For example, when the computer system starts a booting operation, an OS image (not shown) stored in the auxiliary storage 70 may be loaded on the working memory 30 according to a booting sequence. In the computer system, overall input/output operations may be managed by the OS. Some application programs, which may be selected by a user or be provided for basic services, may be loaded on the working memory 30. According to an embodiment of the inventive concept, the layout design tool 32 and/or OPC tool 34 may be loaded on the working memory 30, from the auxiliary storage 70.

The layout design tool 32 may provide a function for changing biasing data for specific layout patterns; for example, the layout design tool 32 may be configured to allow the specific layout patterns to have shapes and positions different from those defined by a design rule. The layout design tool 32 may be configured to perform a design rule check (DRC) under the changed condition of the bias data. The OPC tool 34 may be configured to perform an OPC process on layout data, which is obtained by the layout design tool 32. The working memory 30 may be one of various volatile memory devices (e.g., static random access memory (SRAM) or dynamic random access memory (DRAM) devices) or nonvolatile memory devices (e.g., PRAM, MRAM, ReRAM, FRAM, NOR FLASH memory devices).

The I/O device 50 may be configured to control user input and output operations of user interface devices. For example, the I/O device 50 may include a keyboard or a monitor, thereby allowing a designer to input relevant information. By using the I/O device 50, the designer may receive information on several regions or data paths, to which adjusted operating characteristics will be applied, of a semiconductor device. The I/O device 50 may be configured to display a progress status or a process result of the OPC tool 34.

The auxiliary storage 70 may serve as a storage medium for the computer system. The auxiliary storage 70 may be configured to store application programs, an OS image, and various data. The auxiliary storage 70 may be provided in the form of one of various memory cards (e.g., MMC, eMMC, SD, MicroSD, and so forth) or a hard disk drive (HDD). The auxiliary storage 70 may include a NAND FLASH memory device with a large memory capacity. Alternatively, the auxiliary storage 70 may include at least one of various next-generation nonvolatile memory devices (e.g., PRAM, MRAM, ReRAM, or FRAM) or NOR FLASH memory devices.

A system interconnector 90 may serve as a system bus for realizing a network in the computer system. The CPU 10, the working memory 30, the I/O device 50, and the auxiliary storage 70 may be electrically connected to each other through the system interconnector 90, and thus, data may be exchanged therebetween. However, the system interconnector 90 may not be limited to the afore-described configuration; for example, it may further include an additional element for increasing efficiency in data communication.

Figure 2:
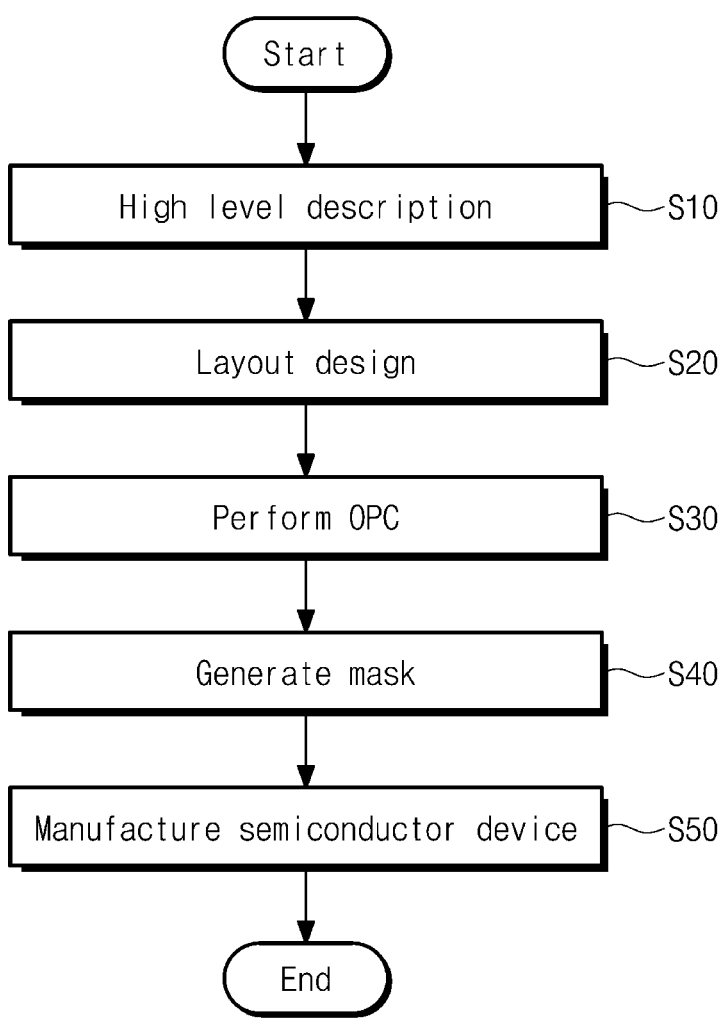
FIG. 2 is a flow chart illustrating a method of designing and fabricating a semiconductor device, according to an embodiment of the inventive concept.

FIG. 2 is a flow chart illustrating a method of designing and fabricating a semiconductor device, according to an embodiment of the inventive concept.

Referring to FIG. 2, a high-level design process for a semiconductor integrated circuit may be performed using the computer system described with reference to FIG. 1 (in S10). For example, in the high-level design process, an integrated circuit to be designed may be described in terms of high-level computer language (e.g., C language). Circuits designed by the high-level design process may be more concretely described by a register transfer level (RTL) coding or a simulation. Furthermore, codes generated by the RTL coding may be converted into a netlist, and the results may be combined with each other to wholly describe a semiconductor device. The combined schematic circuit may be verified by a simulation tool. In an embodiment, an adjusting step may be further performed, in consideration of a result of the verification step.

A layout design process may be performed to realize a logically complete form of the semiconductor integrated circuit on a silicon wafer (in S20). For example, the layout design process may be performed, based on the schematic circuit prepared in the high-level design process or the corresponding netlist. The layout design process may include a routing step of placing and connecting various standard cells that are provided from a cell library, based on a predetermined design rule.

The cell library may contain information on operation, speed, and power consumption of cells. In an embodiment, a cell library for representing a layout of a circuit in a gate level may be defined in or by the layout design tool. Here, the layout may be prepared to define or describe shapes, positions, or dimensions of patterns constituting transistors and metal interconnection lines, which will be actually (i.e., physically) formed on a silicon wafer. For example, in order to actually form an inverter circuit on a silicon wafer, it may be necessary to prepare or draw a layout for patterns (e.g., PMOS, NMOS, N-WELL, gate electrodes, and metal interconnection lines thereon). For this, at least one of various inverters defined in the cell library may be selected.

Furthermore, a routing step of connecting the selected cells to each other may be performed. In detail, the routing step may be performed on the selected and placed standard cells to connect them to upper interconnection lines. The afore-described steps may be automatically or manually performed by the layout design tool. Furthermore, a step of placing and routing the standard cells may be automatically performed by an additional place & routing tool.

After the routing step, a verification step may be performed on the layout to check whether there is a portion violating the given design rule. In an embodiment, the verification step may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) step (e.g., operation/process) may be performed (in S30). The OPC step may be performed to correct optical proximity effects, which may occur when a photolithography process is performed on a silicon wafer using a photomask manufactured based on the layout. The optical proximity effect may be an unintended optical effect (such as refraction or diffraction) which may occur in the exposing process using the photomask manufactured based on the layout. In the OPC step, the layout may be modified to reduce a difference in shape between designed patterns and actually-formed patterns, which may be caused by the optical proximity effects. As a result of the OPC step, the shapes and positions of patterns in the designed layout may be changed or biased. The OPC step will be described in more detail with reference to FIGS. 3 to 8.

A photomask may be manufactured, based on the layout modified by the OPC step (in S40). In general, the photomask may be manufactured by patterning a chromium layer provided on a glass substrate, using the layout pattern data.

The photomask that is manufactured may be used to manufacture a semiconductor device (in S50), such as by using the photomask to form a photomask pattern on a substrate. In the actual (i.e., physical) fabricating process, the exposing and etching steps may be repeatedly performed, and thus, patterns defined in the layout design process may be sequentially formed on a semiconductor substrate.

Figure 3:
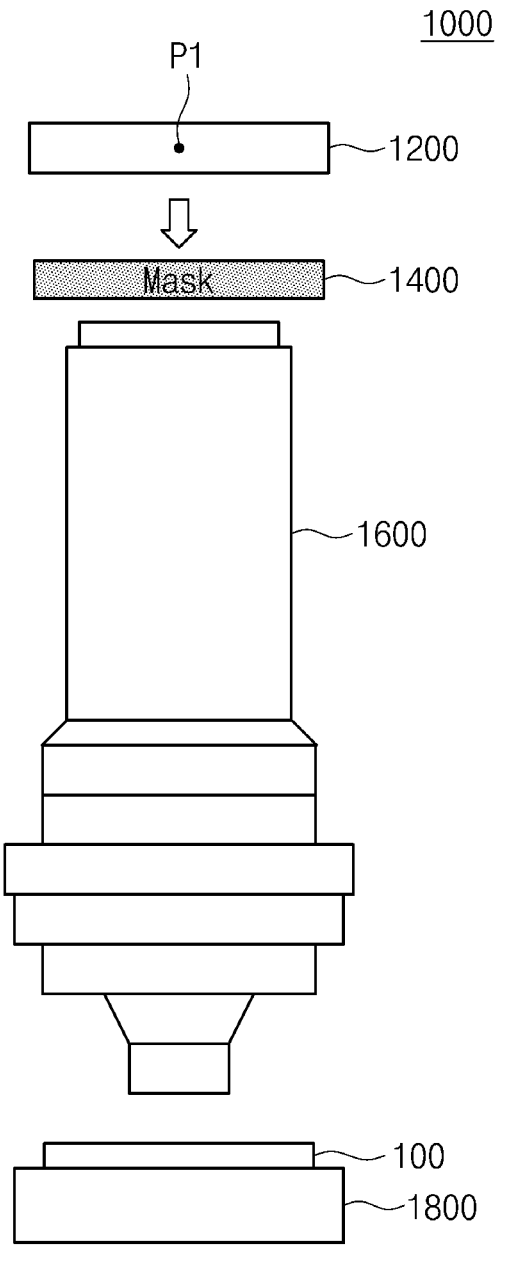
FIG. 3 is a conceptual diagram illustrating a photolithography system using a photomask according to an embodiment of the inventive concept.

FIG. 3 is a schematic diagram illustrating a photolithography system, in which a photomask according to an embodiment of the inventive concept is used. A photolithography system 1000 may include a light source 1200, a photomask 1400, a reduction projection apparatus 1600, and a substrate stage 1800. Although not illustrated in FIG. 3, some additional elements may be provided in the photolithography system 1000. For example, the photolithography system 1000 may further include a sensor for measuring a height and a slope of a top surface of a substrate 100.

The light source 1200 may be configured to emit light. The light emitted from the light source 1200 may be incident into the photomask 1400. To control a focal length, a lens may be provided between the light source 1200 and the photomask 1400. The light source 1200 may be configured to emit an ultraviolet light; for example, the light source 1200 may be a krypton fluoride (KrF) light source (at 234 nanometers (nm)), an argon fluoride (ArF) light source (at 193 nm), or an extreme ultraviolet (EUV) light source. In an embodiment, the light source 1200 may be the EUV light source. The light source 1200 may include a single point light source P1, but the inventive concept may not be limited thereto. In an embodiment, the light source 1200 may be configured to have a plurality of point light sources.

The photomask 1400 may include image patterns, which are used to transcribe or print the designed layout onto the substrate 100. The image patterns may be formed, based on layout patterns, which are prepared through layout design and OPC steps described above. The image patterns may be defined by transparent and opaque regions formed on the photomask 1400. The transparent region may be formed by etching the metal layer (e.g., the chromium layer) that is provided on the photomask 1400. The transparent region may be configured to allow light, which is incident from the light source 1200, to propagate toward the substrate 100. By contrast, the opaque region may be configured to inhibit/prevent the light from propagating toward the substrate 100.

The light passing through the transparent region of the photomask 1400 may be incident onto/into a photoresist layer, which is formed on the substrate 100, through the reduction projection apparatus 1600, and as a result, photoresist patterns may be formed on the substrate 100. The photoresist patterns may have shapes corresponding to the image patterns of the photomask 1400. That is, by using the reduction projection apparatus 1600, it may be possible to form the photoresist patterns, whose shapes are defined by the image patterns of the photomask 1400, on the substrate 100.

The substrate stage 1800 may be configured to support the substrate 100. The substrate 100 may include, for example, a silicon wafer. The reduction projection apparatus 1600 may include an aperture. The aperture may be used to control a depth of focus, when the ultraviolet light emitted from the light source 1200 is incident onto the substrate 100. As an example, the aperture may include a dipole or quadruple aperture. The reduction projection apparatus 1600 may further include a lens for controlling a focal length.

As an integration density of a semiconductor device increases, a distance between the image patterns of the photomask 1400 may be reduced, thereby causing a proximity issue such as undesired interference and diffraction. As a result of the proximity issue, the photoresist patterns formed on the substrate 100 may have distorted shapes (i.e., different from those of the image patterns of the photomask 1400). The distortion of the photoresist patterns may lead to malfunction of an electronic device or circuit to be formed on the substrate 100.

A resolution enhancement technology may be used to reduce/prevent the distortion of the photoresist patterns. An OPC technology, which is used in the step S30 of FIG. 2, may be an example of the resolution enhancement technology. According to the OPC technology, the optical distortion issue, which is caused by interference and diffraction, may be quantitatively predicted (e.g., estimated/simulated) by a simulation process using an OPC model. The designed layout may be corrected or biased, based on the predicted result. Based on the corrected layout, image patterns may be formed on the photomask 1400, and in the case where the photomask 1400 is manufactured by this method, the photoresist patterns may be formed in desired shapes on the substrate 100.

A layout of a semiconductor device may include a plurality of layers. In an embodiment, the OPC step may be performed to correct a layout for each of the layers. In other words, the OPC step may be independently performed on each of the plurality of layers. A semiconductor device may be fabricated by forming the plurality of layers on a substrate through a semiconductor process. As an example, a semiconductor device may include a plurality of stacked metal layers constituting a specific circuit.

Figure 4:
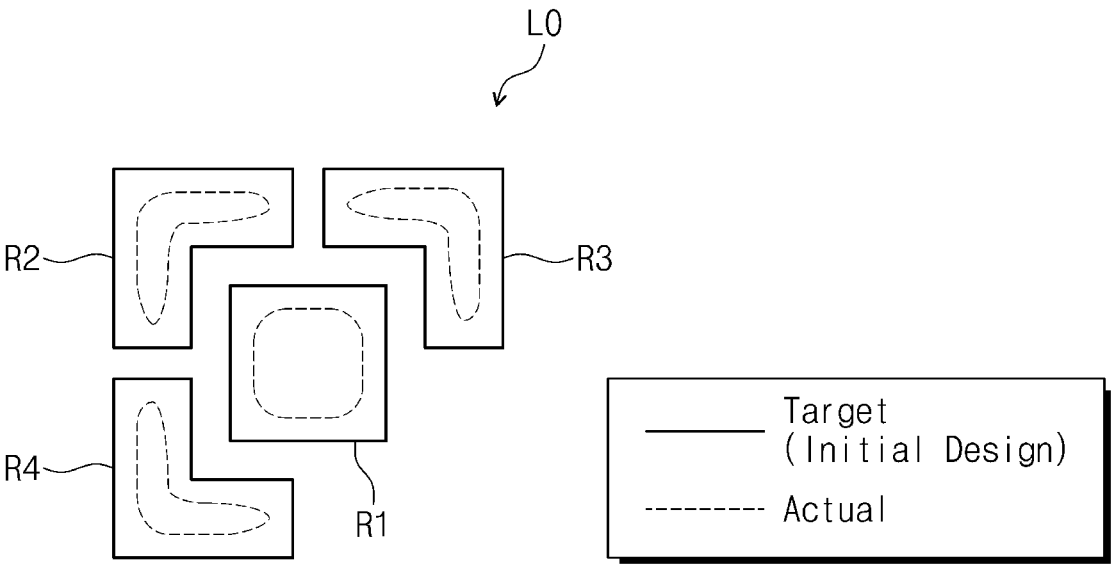
FIG. 4 is a conceptual diagram illustrating a layout according to an embodiment of the inventive concept.

FIG. 4 is a conceptual diagram illustrating a layout according to an embodiment of the inventive concept. In FIG. 4, a solid line depicts target patterns that are desired to be formed on the substrate 100 of FIG. 3, and a dotted line depicts actual patterns that are actually formed on the substrate 100 of FIG. 3.

A designed layout LO may include first to fourth circuit patterns R1, R2, R3, and R4. In order to reduce complexity in the drawings and to provide better understanding of the inventive concept, an example of a shape of the designed layout LO is illustrated in FIG. 4, but the inventive concept is not limited thereto. The designed layout LO may be provided as an initial design layout. The first to fourth circuit patterns R1, R2, R3, and R4, which are depicted by the solid lines in FIG. 4, may illustrate target patterns that are intended/desired to be formed on the substrate 100.

As described above, owing to the optical distortion issue caused by interference and diffraction, photoresist patterns on the substrate 100 may have shapes different from those in the designed layout LO. For example, even when the image patterns of the photomask 1400 are formed to have shapes depicted by the solid lines of FIG. 4, the first to fourth circuit patterns R1, R2, R3, and R4 to be formed on the substrate 100 may have distorted shapes that are depicted by the dotted lines of FIG. 4. In this case, a circuit formed on the substrate 100 may be abnormally operated.

An OPC step may be performed to reduce/prevent the distortion of the patterns. For example, to reduce a difference between the actual pattern (depicted by the dotted line of FIG. 4) and the target pattern (depicted by the solid line of FIG. 4), the designed layout LO may be biased (i.e., modified) through the OPC step. The image patterns of the photomask 1400 may be formed, based on the biased layout. In the case where the photomask 1400 manufactured through this process is used for a photolithography process, the actual patterns may be formed on the substrate 100 to have substantially the same shapes as those of the first to fourth circuit patterns R1, R2, R3, and R4 defined in the designed layout LO.

Figure 5:
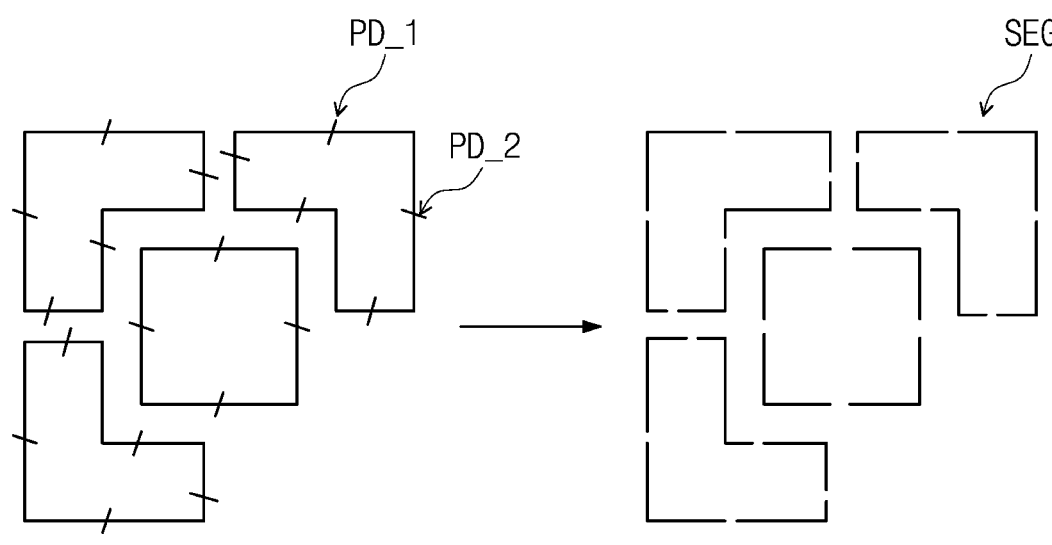
FIG. 5 is a conceptual diagram illustrating a process of dividing a contour of a designed layout of FIG. 4 into a plurality of segments, as a part of an optical proximity correction operation.

FIG. 5 is a conceptual diagram illustrating a process, which is performed to divide a contour of a designed layout of FIG. 4 into a plurality of segments, as a part of the OPC step. Referring to FIG. 5, a plurality of division points may be set on a contour of a designed layout. As an example, a first division point PD_1 and a second division point PD_2 may be set on the contour of the designed layout. One segment SEG may be defined by the first division point PD_1 and the second division point PD_2. The contour of the designed layout may be divided into a plurality of segments in a similar manner, based on the division points.

In the present specification, the term "division" may not mean a physical division. Furthermore, although in FIG. 5 a plurality of segments are illustrated as if they were physically spaced apart from each other, FIG. 5 is just a schematic diagram that is presented for the purpose of providing better understanding of the inventive concept.

In the OPC step, each of the divided segments SEG may be a unit object, to which the biasing can be applied. Each of the divided segments SEG may be independently biased (i.e., independently modified). For example, one of the segments SEG may be biased in one of a first direction (e.g., a positive or outward direction) and a second direction (e.g., a negative or inward direction), independent of the others of the segments SEG. Each of the divided segments SEG may be biased to reduce a difference in shape or size between the actual and target patterns. The biasing of the divided segments SEG may be performed by the OPC tool 34 of FIG. 1. An example of a corrected layout, which is obtained based on the biased segments, is illustrated in FIG. 6.

Figure 6:
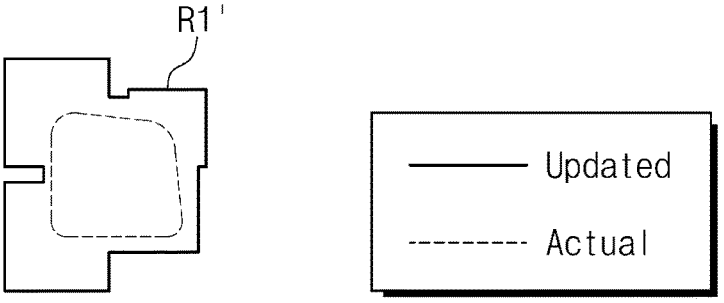
FIG. 6 is a conceptual diagram illustrating a layout corrected by the optical proximity correction of FIG. 5.

FIG. 6 is a conceptual diagram illustrating a layout corrected by the OPC step of FIG. 5. Referring to FIG. 6, the corrected layout may include a first correction pattern R1' that is corrected from the first circuit pattern R1 of FIG. 4. For convenience in illustration, the second to fourth circuit patterns R2, R3, and R4 of FIG. 4 are omitted from FIG. 6. As previously described with reference to FIG. 5, the contour of the first circuit pattern R1 of FIG. 4 may be divided into a plurality of segments, and each of the divided segments may be biased. As illustrated in FIG. 6, each of the segments may be biased in one of the first direction (e.g., the positive or outward direction) and the second direction (e.g., the negative or inward direction). In an embodiment, at least one of the segments may not be biased. FIG. 6 shows an example of the first correction pattern R1' that is obtained as a result of the biasing.

The dotted line of FIG. 6 depicts an actual pattern, which will be actually formed on the substrate 100 of FIG. 3 when the corrected layout is used. By biasing each of the divided segments, it may be possible to reduce a difference between the actual pattern and the target pattern.

Figure 7:
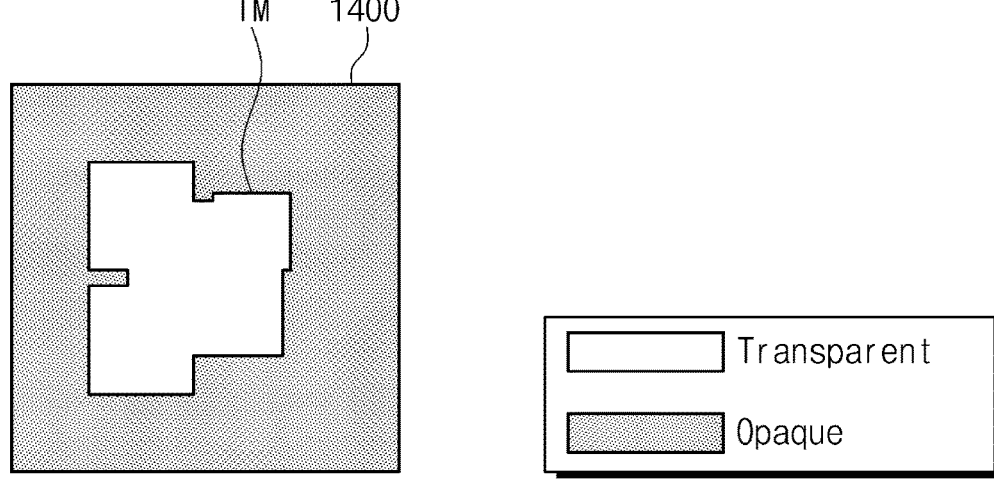
FIG. 7 is a conceptual diagram illustrating a photomask manufactured based on the corrected layout of FIG. 6.

FIG. 7 is a conceptual diagram illustrating a photomask fabricated based on the corrected layout of FIG. 6. A mask rule check (MRC) step may be performed on the corrected layout of FIG. 6, and then, mask data may be generated. A photomask may be manufactured, based on the mask data (and thus based on the corrected layout).

As an example, referring to FIG. 7, the photomask 1400 may include an image pattern IM corresponding to the first correction pattern R1' of FIG. 6. The photomask 1400 may include a transparent region and an opaque region. The opaque region may be configured to inhibit/prevent light from passing therethrough. By contrast, the transparent region may be configured to allow light, which is emitted from the light source 1200 of FIG. 3, to pass therethrough. Light passing through the photomask 1400 may be incident onto/into a photoresist layer on the substrate 100 of FIG. 3. For example, in the case where a negative photoresist layer is used for the photolithography process, the image pattern IM may be the transparent region.

Figure 8:
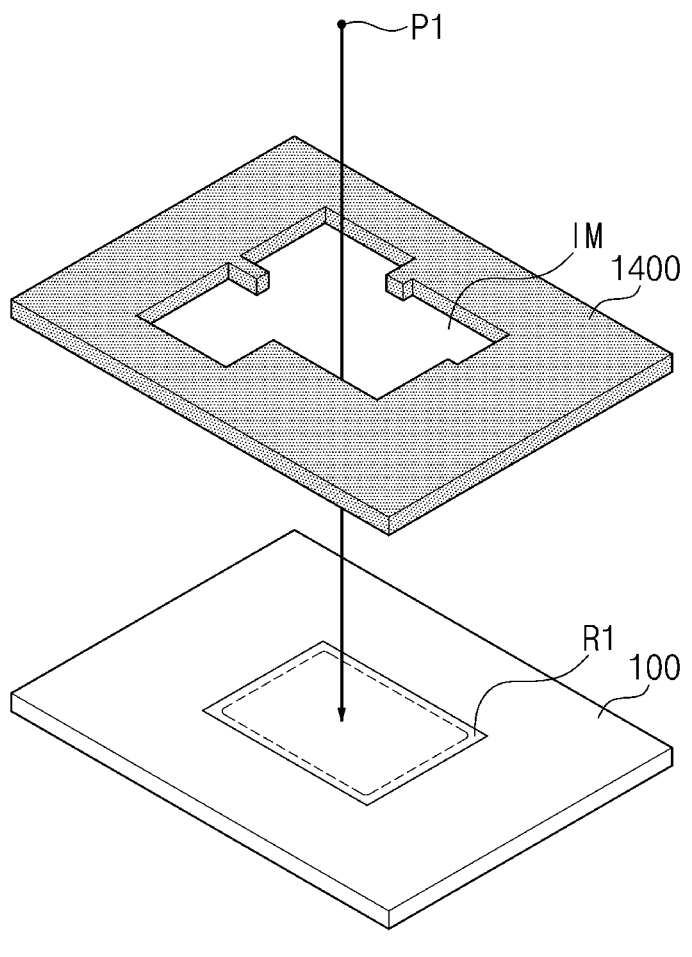
FIG. 8 is a conceptual diagram illustrating a photolithography process of printing a circuit pattern on a substrate, using the photomask of FIG. 7.

FIG. 8 is a conceptual diagram illustrating a photolithography process of printing a circuit pattern on a substrate, using the photomask of FIG. 7. A point light source P1 in the light source 1200 of FIG. 3 may be configured to emit light toward the photomask 1400. In an exposure step, the emitted light may pass through the transparent region of the image pattern IM and then may be incident onto/into the negative photoresist layer on the substrate 100. A region of the negative photoresist layer, which is exposed to the light, may be left, and another region of the negative photoresist layer, which is not exposed to the light, may be removed, in a subsequent developing step. Accordingly, the first circuit pattern R1 corresponding to the image pattern IM may be formed on the substrate 100.

An actual pattern printed on the substrate 100 may have a shape depicted by the dotted line. The actual pattern may have substantially the same shape and size as those of the target pattern depicted by the solid line. That is, by using the afore-described OPC step, it may be possible to reduce a difference between the actual and target patterns.

Figure 9:
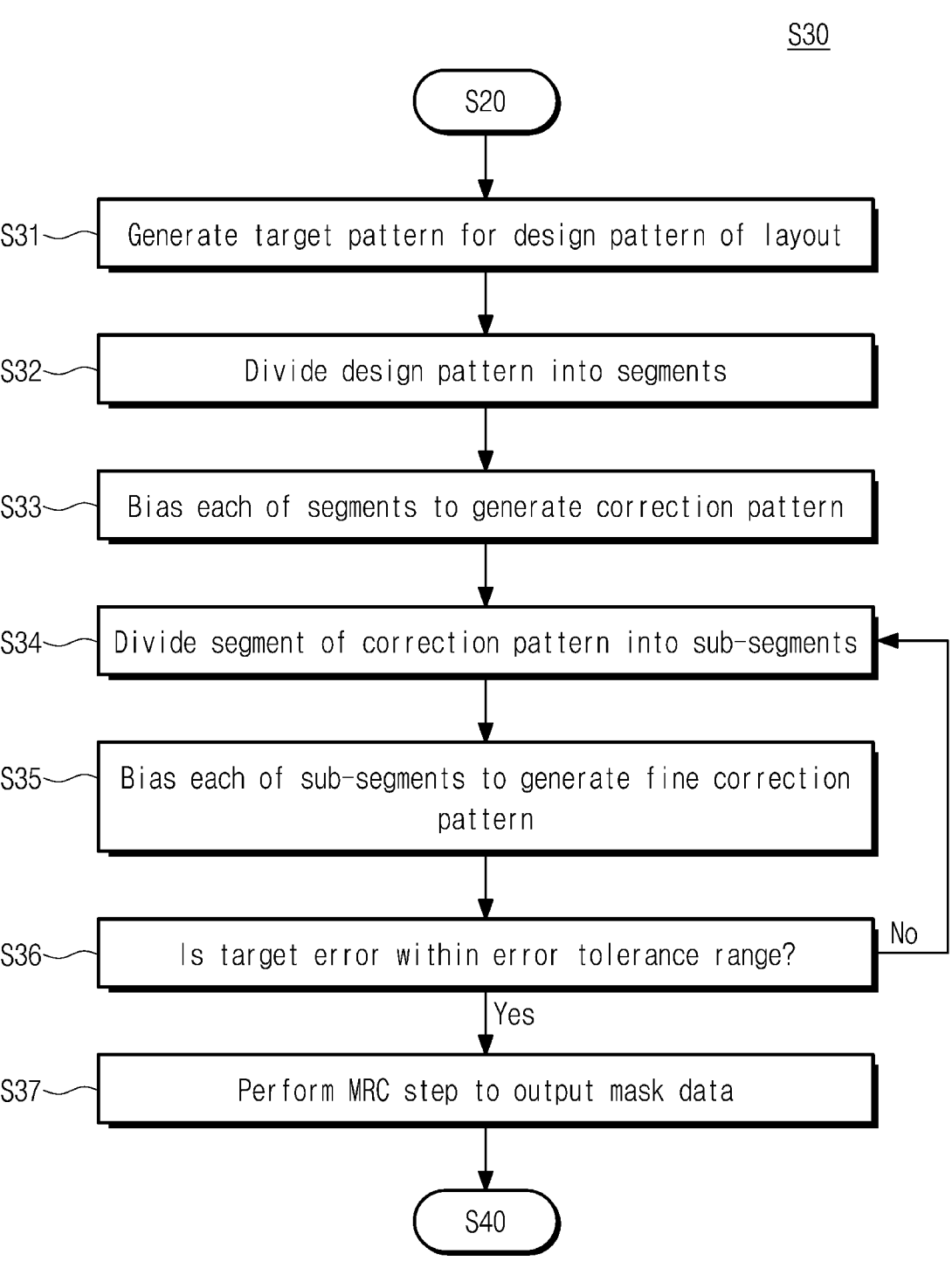
FIG. 9 is a flow chart schematically illustrating some steps in an optical proximity correction according to an embodiment of the inventive concept.

FIG. 9 is a flow chart schematically illustrating some steps in an optical proximity correction according to an embodiment of the inventive concept. FIGS. 10 to 14 are layout plan views illustrating the optical proximity correction of FIG. 9.

Figure 10:
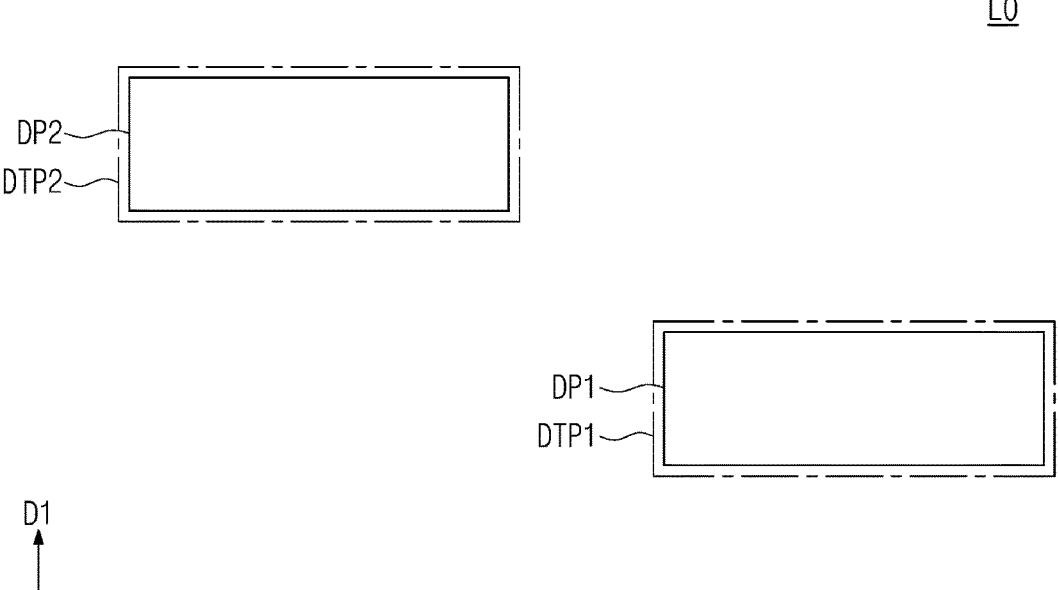
FIGS. 10 to 14 are layout plan views illustrating the optical proximity correction of FIG. 9.

Referring to FIGS. 9 and 10, a layout LO, which is generated through the layout design step S20 previously described with reference to FIG. 2, may be provided. The layout LO may be a layout of a single layer. The layout LO may include a first design pattern DP1 and a second design pattern DP2, which are adjacent to each other. The first and second design patterns DP1 and DP2 may correspond to the circuit patterns R1-R4 previously described with reference to FIG. 4.

A first target pattern DTP1 and a second target pattern DTP2 may be respectively generated for the first and second design patterns DP1 and DP2 (in S31). Each of the first and second target patterns DTP1 and DTP2 may be generated from a corresponding design pattern through a table driven layout operation (TDLO) step. A target pattern DTP may be generated to define a size of a photoresist pattern, which will be formed by developing a photoresist layer during a photolithography process. That is, the target pattern DTP may be generated to define a desired size of the photoresist pattern which will be actually formed by the developing step.

According to an embodiment of the inventive concept, each of the first and second design patterns DP1 and DP2 may define a size and a shape of a final pattern, which will be formed in an etch target layer under the photoresist layer. The final pattern in the etch target layer may be formed to have a size smaller than that of the photoresist pattern formed by the photolithography process. This is because an inclined etching profile occurs during patterning the etch target layer using the photoresist pattern as an etch mask. In sum, the generating of the first and second target patterns DTP1 and DTP2 (in S31) may be performed to reduce a difference in size between the photoresist pattern, which is formed by developing the photoresist layer, and the final pattern, which is formed in the etch target layer.

A data preparation step may be performed on the layout LO including the first and second design patterns DP1 and DP2. The data preparation step may include performing an OPC step on the designed layout (in S30) and performing a mask rule check (MRC) step on the result of the OPC step (in S37). Hereinafter, the OPC step according to some embodiments will be described in more detail.

Figure 11:
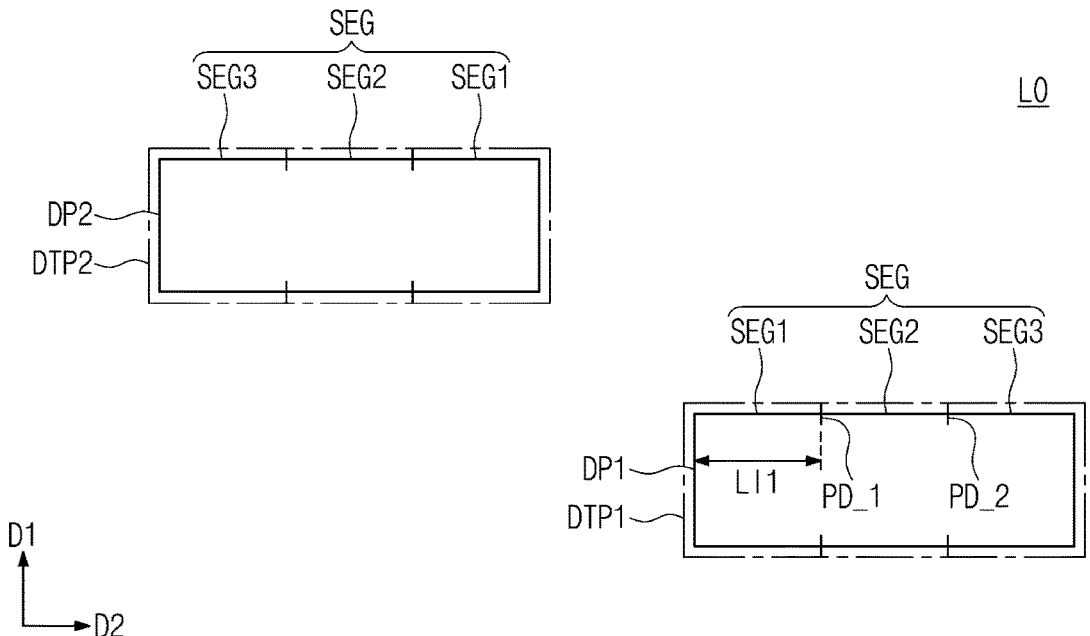

Referring to FIGS. 9 and 11, each of the first and second design patterns DP1 and DP2 may be divided into a plurality of segments SEG (in S32). For example, the first division point PD_1 and the second division point PD_2 may be defined on a contour of the first design pattern DP1. First, second, and third segments SEG1, SEG2, and SEG3 may be generated by the division based on the first division point PD_1 and the second division point PD_2. In an embodiment, the first segment SEG1 may have a first length LI1 in a second direction D2.

The second design pattern DP2 may be divided into a plurality of segments SEG1, SEG2, and SEG3, similar to the first design pattern DP1. The step of dividing each of the first and second design patterns DP1 and DP2 into the segments SEG may be performed in the same manner as described with reference to FIG. 5.

Figure 12:
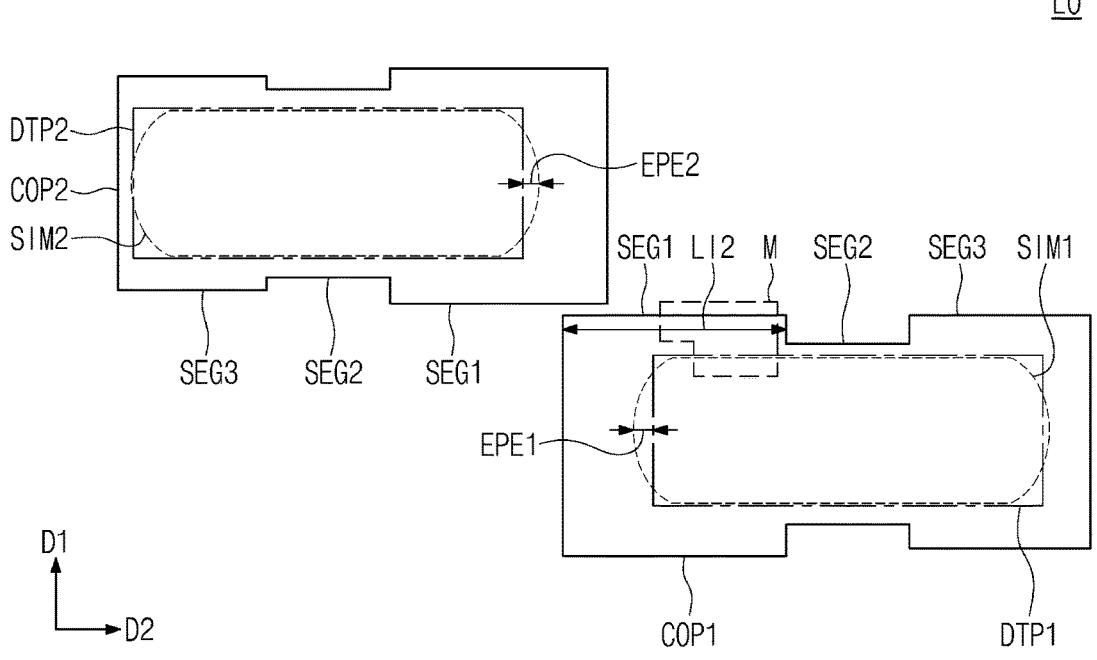

Referring to FIGS. 9 and 12, a first correction pattern COP1 and a second correction pattern COP2 may be respectively generated by biasing or modifying the segments SEG of each of the first and second design patterns DP1 and DP2 (in S33). For example, each of the segments SEG of the first design pattern DP1 may be biased, as previously described with reference to FIG. 6. Each of the segments SEG may be biased or modified in a first direction D1 and/or a second direction D2.

In detail, the first to third segments SEG1 to SEG3 of the first correction pattern COP1 may be biased in the first direction D1 or an opposite direction thereof. As an example, the first segment SEG1 may be biased to have a second length LI2 in the second direction D2. The second length LI2 may be larger than the first length LI1 of the first segment SEG1 of the first design pattern DP1.

The first correction pattern COP1 may have a first simulation contour SIM1, which is generated by a simulation process based on an OPC model. The first to third segments SEG1 to SEG3 may be biased such that the first simulation contour SIM1 substantially/maximally conforms to the first target pattern DTP1 in its size and position. The biasing of the first to third segments SEG1 to SEG3 may be iterated until the first simulation contour SIM1 substantially/maximally conforms to the first target pattern DTP1 in its size and position. Accordingly, the first correction pattern COP1 may have a contour different from the first design pattern DP1. The second correction pattern COP2 may also be generated by the same method as the first correction pattern COP1 described above.

A first target error EPE1 between the first simulation contour SIM1 of the first correction pattern COP1 and the first target pattern DTP1 may be measured. The first target error EPE1 may mean a distance between an edge portion of the first target pattern DTP1 and the first simulation contour SIM1. A second target error EPE2 between a second simulation contour SIM2 of the second correction pattern COP2 and the second target pattern DTP2 may also be measured.

It may be determined/examined whether the first and second target errors EPE1 and EPE2 are within an error tolerance range. This may be achieved by calculating/examining whether a value of the target error is less than a layout database unit (dbu) which is the minimum unit of the OPC tool (e.g., see the OPC tool 34 of FIG. 1).

The first and second target errors EPE1 and EPE2 of FIG. 12 according to some embodiments may be beyond the error tolerance range, and in this case, an additional correction step should be further performed on the first and second correction patterns COP1 and COP2.

Figure 13:
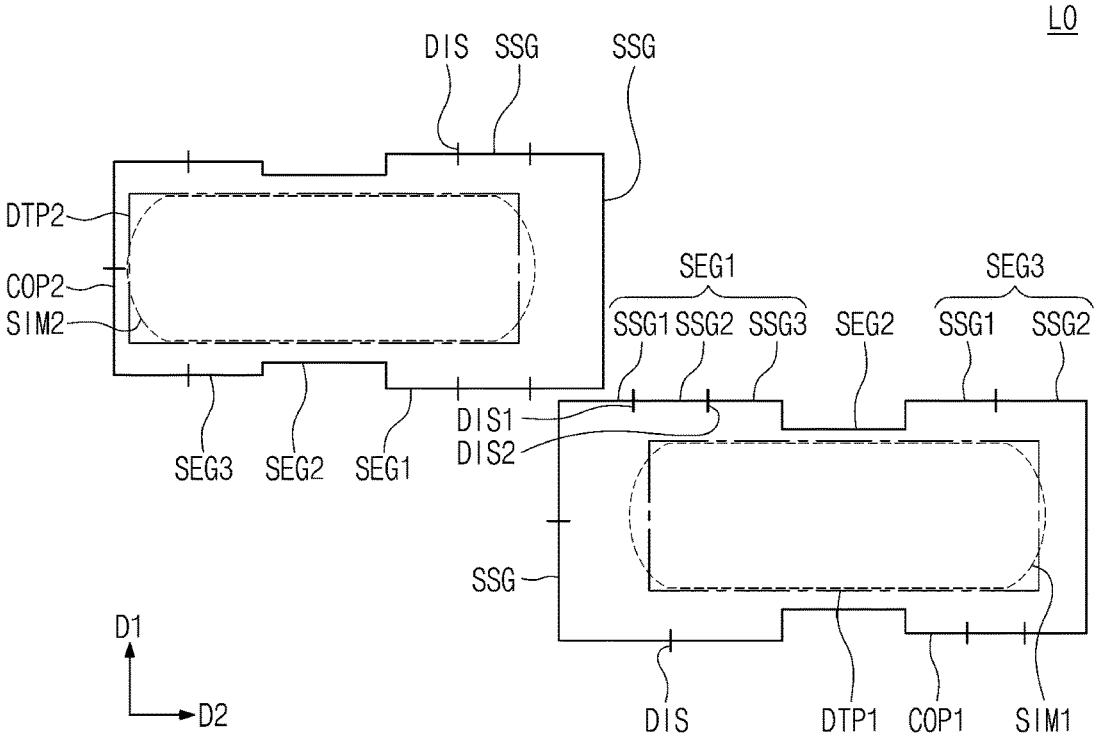

Referring to FIGS. 10 and 13, at least one of the segments SEG of the first and second correction patterns COP1 and COP2 may be divided or dissected into a plurality of sub-segments SSG (in S34). For example, the first segment SEG1 of the first correction pattern COP1 may be elongated to have the second length LI2, which is much larger than the first length LI1 before the correction. It may be difficult to finely perform the OPC step on the first segment SEG1 having the increased length. In some embodiments, a first dissection point DIS1 and a second dissection point DIS2 may be defined on the first segment SEG1 having the increased length.

First, second, and third sub-segments SSG1, SSG2, and SSG3, which are divided from the first segment SEG1, may be generated, based on the first dissection point DIS1 and the second dissection point DIS2. Each of the first, second, and third sub-segments SSG1, SSG2, and SSG3 may have a length, which is smaller than the second length LI2, when measured in the second direction D2.

The third segment SEG3 of the first correction pattern COP1 may also be divided into a plurality of the sub-segments SSG. For example, the third segment SEG3 may be divided into the first and second sub-segments SSG1 and SSG2. In an embodiment, the number of the sub-segments, which are divided from the first segment SEG1, may be three, and the number of the sub-segments, which are divided from the third segment SEG3, may be two. In an embodiment, n sub-segments SSG may be generated by equally dividing one segment SEG into n parts, where n is an integer between 2 and 10.

Since the second segment SEG2 of the first correction pattern COP1 has a length that is not increased compared with the second segment SEG2 of the first design pattern DP1, it may be left as it is. That is, in an embodiment, the second segment SEG2 may not be divided into a plurality of the sub-segments SSG. Each of the first and third segments SEG1 and SEG3 of the second correction pattern COP2 may also be divided into a plurality of the sub-segments SSG.

In an embodiment, the dividing of the first segment SEG1 into the first to third sub-segments SSG1 to SSG3 may be automatically performed based on a specific criterion. For example, in the case where, during the OPC step, a length of the segment SEG is increased to a value larger than a specific (e.g., predetermined threshold) length, the segment SEG may be automatically and equally divided into n parts to generate n sub-segments SSG.

In another embodiment, in the case where a ripple of the first simulation contour SIM1 is increased to be larger than a specific width, the segment SEG corresponding to the ripple may be equally divided into n parts to generate n sub-segments SSG.

In other embodiments, the dividing of the first segment SEG1 into the first to third sub-segments SSG1 to SSG3 may include generating a dissection point DIS at a point at which the amplitude of the ripple of the first simulation contour SIM1 is abruptly changed. This will be described with reference to FIGS. 15 to 17.

Figure 14:
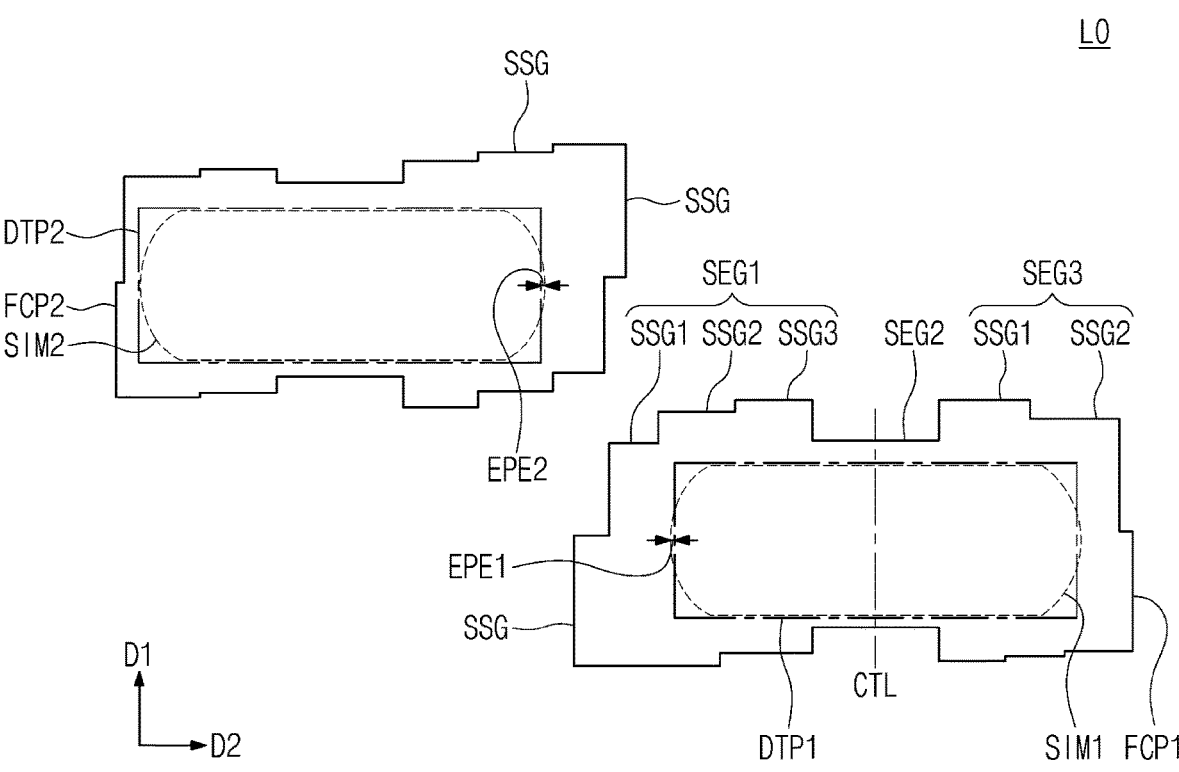

Referring to FIGS. 10 and 14, a first fine correction pattern FCP1 and a second fine correction pattern FCP2 may be generated by biasing (i.e., modifying) the sub-segments SSG of the first and second correction patterns COP1 and COP2, respectively (in S35). Each of the sub-segments SSG may be biased in the first direction D1 and/or in the second direction D2. For example, each of the first to third sub-segments SSG1 to SSG3 of the first correction pattern COP1 may be biased in the first direction D1 or an opposite direction thereof. The biasing of the first to third sub-segments SSG1 to SSG3 may be substantially the same as or similar to the biasing of the segments SEG described above.

The first to third sub-segments SSG1 to SSG3 may be biased such that the first simulation contour SIM1 of the first correction pattern COP1 substantially/maximally conforms to the first target pattern DTP1 in its size and position. The biasing of the first to third sub-segments SSG1 to SSG3 may be iterated until the first simulation contour SIM1 substantially/maximally conforms to the first target pattern DTP1 in its size and position. During the biasing of the first to third sub-segments SSG1 to SSG3, the existing segments SEG may also be biased.

Since the first to third sub-segments SSG1 to SSG3 are biased, the first fine correction pattern FCP1 having a more complex and fine structure (e.g., a more detailed structure defined by additional line segments) may be generated from the first correction pattern COP1. Similarly, the second fine correction pattern FCP2 having a more complex and fine structure may be generated from the second correction pattern COP2.

A first target error EPE1 between a first simulation contour SIM1 of the first fine correction pattern FCP1 and the first target pattern DTP1 may be measured. A second target error EPE2 between a second simulation contour SIM2 of the second fine correction pattern FCP2 and the second target pattern DTP2 may also be measured.

It may be determined/examined whether the first and second target errors EPE1 and EPE2 are within an error tolerance range (in S36). For example, in the case where the first target error EPE1 is beyond the error tolerance range, the step S34 of dividing a segment into a plurality of sub-segments and the step S35 of biasing the sub-segments may be iteratively performed on the first fine correction pattern FCP1. The steps S34 and S35 may be iteratively performed until the first target error EPE1 is within the error tolerance range. As the steps S34 and S35 are iteratively performed, the first fine correction pattern FCP1 may be gradually changed from a polygonal shape to a fine (e.g., curvilinear) shape.

In an embodiment, as described above, the number (i.e., three) of the sub-segments SSG1 to SSG3, which are divided from the first segment SEG1, may be different from the number (i.e., two) of the sub-segments SSG1 and SSG2, which are divided from the third segment SEG3. Accordingly, left and right portions of the first fine correction pattern FCP1 may be asymmetric to each other.

For example, three segments SSG1, SSG2, and SSG3, which are divided from the first segment SEG1, may exist at a side of a center line CTL (e.g., a center axis), which passes through a center (e.g., a center point) of the first fine correction pattern FCP1 in the first direction D1. By contrast, two segments SSG1 and SSG2, which are divided from the third segment SEG3, may exist at an opposite side of the center line CTL. That is, in the first fine correction pattern FCP1 according to an embodiment of the inventive concept, the number of the segments adjacent to a side of the center line CTL may be different from the number of the segments adjacent to an opposite side of the center line CTL. In the first fine correction pattern FCP1, due to the difference between the numbers of the segments provided at both (i.e., opposite) sides of the center line CTL, the first fine correction pattern FCP1 may have an asymmetric shape about the center line CTL.

The OPC step according to an embodiment of the inventive concept may include a process of dividing one segment to generate a plurality of sub-segments, and as the OPC step progresses, the process may be repeated. The number of the segments of the fine correction pattern after the OPC step may be greater than the number of the original segments of the design pattern before the OPC step. In other words, as the OPC step according to an embodiment of the inventive concept progresses, the number of the segments of the correction pattern may be increased, and as a result, the correction pattern may have a fine or accurate shape or may be changed from a polygonal shape to a curvilinear (e.g., curved/rounded) shape.

In the case where the first and second target errors EPE1 and EPE2 are within an error tolerance range, an MRC step may be performed on the layout LO including the first and second fine correction patterns FCP1 and FCP2 (in S37). Since the first and second fine correction patterns FCP1 and FCP2 are additionally corrected through the MRC step, all errors violating the mask rule may be removed. Accordingly, the data preparation step may be finished, and the final result may be output as mask data.

As previously described with reference to FIGS. 2, 7, and 8, the photomask 1400 may be manufactured, based on the mask data. A photolithography process using the photomask 1400 may be performed on the substrate 100. Accordingly, desired patterns may be realized on the substrate 100. The patterns may be formed to have the same shape and size as the first and second design patterns DP1 and DP2 previously described with reference to FIG. 10. As a result, by forming target patterns in each layer using this method, it may be possible to fabricate a semiconductor device (in S50 of FIG. 2), such as by using the photomask 1400 to form a photomask pattern on the substrate 100.

Figure 15:
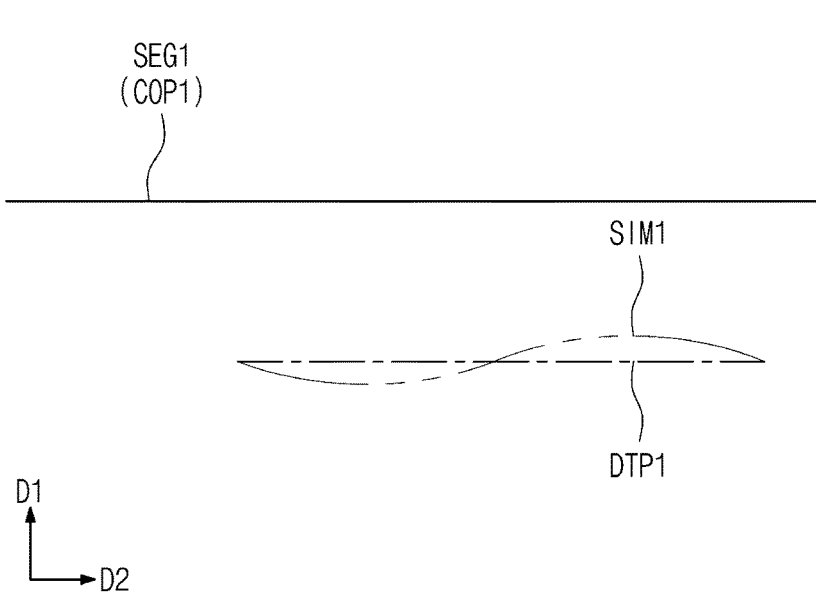
FIGS. 15 to 17 are layout plan views illustrating a method of dividing a segment into a plurality of sub-segments, according to an embodiment of the inventive concept.
Figure 16:
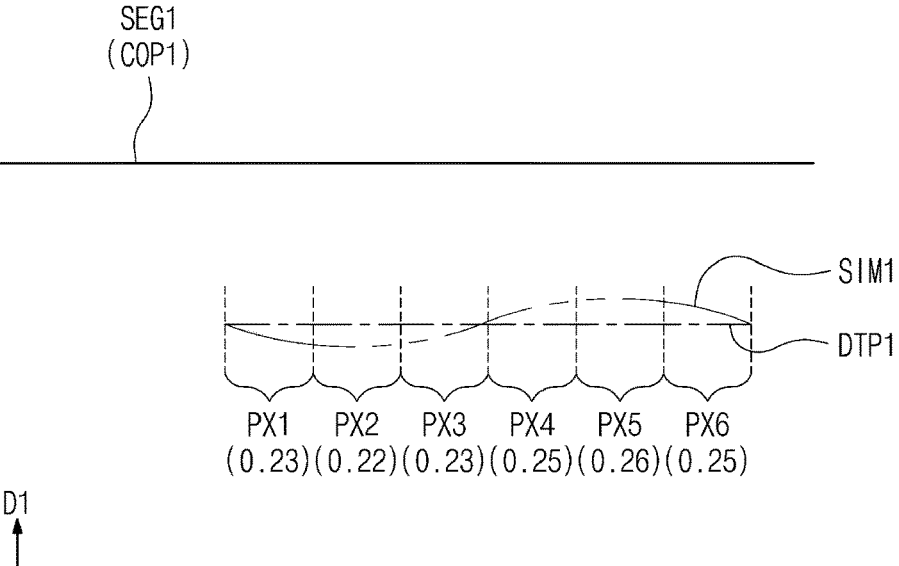
Figure 17:
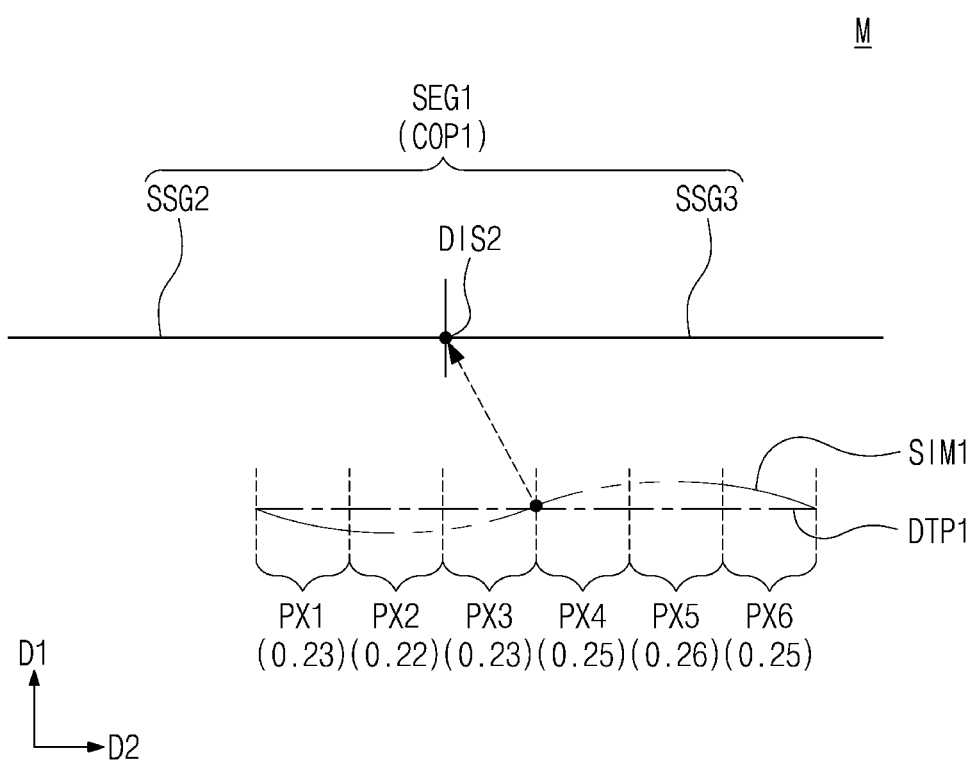

FIGS. 15 to 17 are layout plan views illustrating a method of dividing a segment into a plurality of sub-segments, according to an embodiment of the inventive concept. In detail, each of FIGS. 15 to 17 is an enlarged view illustrating a portion 'M' of FIG. 12.

Referring to FIGS. 12 and 15, the first segment SEG1 of the first correction pattern COP1 and the first simulation contour SIM1 corresponding thereto are illustrated. The first simulation contour SIM1 may include a ripple. An intensity of light, which is incident onto/into a photoresist layer through an actual photomask, may be slightly changed by a shape of an image pattern on the photomask. Since the intensity of light is changed depending on position, the first simulation contour SIM1 may be a ripple of a wavy shape, not of a linear shape, when viewed in an enlarged view of the first simulation contour SIM1.

If the ripple of the first simulation contour SIM1 and the contour of the first target pattern DTP1 meet each other with a specific period, the OPC tool 34 may determine that the first simulation contour SIM1 is matched with the first target pattern DTP1. However, even when a varying magnitude (i.e., amplitude) of the ripple of the first simulation contour SIM1 is greater than a specific (e.g., predetermined threshold) value (e.g., 2 nm), the OPC tool 34 may determine that the first simulation contour SIM1 and the first target pattern DTP1 are matched with each other. In this case, a process defect may occur in an actual photolithography process.

Even when the first segment SEG1 has a length larger than a specific length, an amplitude of the ripple of the first simulation contour SIM1 may be increased. Accordingly, in order to perform the OPC step in a more accurate manner, it may be beneficial to divide the first segment SEG1, when (e.g., in response to determining that) the length of the first segment SEG1 is larger than the specific length or the amplitude of the ripple of the first simulation contour SIM1 is larger than the specific value.

Referring to FIGS. 12 and 16, the first simulation contour SIM1 may be divided into a plurality of pixels PX1-PX6. For example, as part of generating a dissection point DIS, the ripple of the first simulation contour SIM1 may be divided into first to sixth pixels PX1-PX6.

A respective value of a light intensity in each of the first to sixth pixels PX1-PX6 may be calculated. As described above, the light intensity may mean an intensity of light which is irradiated onto a photoresist layer during a photolithography process. For example, the intensities of the first to third pixels PX1-PX3 may have values of 0.23, 0.22, and 0.23, respectively. Since the intensities of the first to third pixels PX1-PX3 are smaller than 0.24, the first simulation contour SIM1 may be located inside the first target pattern DTP1. The intensities of the fourth to sixth pixels PX4-PX6 may have values of 0.25, 0.26, and 0.25, respectively. Since the intensities of the fourth to sixth pixels PX4-PX6 are greater than 0.24, the first simulation contour SIM1 may be located outside the first target pattern DTP1.

Referring to FIGS. 12 and 17, a difference in intensity value between adjacent ones of the pixels may be calculated to select (e.g., choose) pixels, in which the intensity difference is high/maximized. For example, a difference in intensity between the third and fourth pixels PX3 and PX4 may be 0.02. However, the intensity differences between other adjacent pixels may be 0.01. In other words, the intensity difference between the third and fourth pixels PX3 and PX4 may be highest, and the third and fourth pixels PX3 and PX4 may be chosen.

A dissection point may be defined between the third and fourth pixels PX3 and PX4 having the largest intensity difference. A point of the first segment SEG1, which corresponds to (e.g., which is) a point between the third and fourth pixels PX3 and PX4, may be defined as the second dissection point DIS2. The first segment SEG1 may be divided into the second and third sub-segments SSG2 and SSG3 described above, based on the second dissection point DIS2.

In a method of dividing a segment into a plurality of sub-segments according to some embodiments, a point, at which a light intensity on a simulation result is abruptly changed, may be selectively designated as a dissection point. Accordingly, by biasing sub-segments, which are generated at the point, in a more accurate manner, it may be possible to provide a more accurate OPC result for the point.

Figure 18:
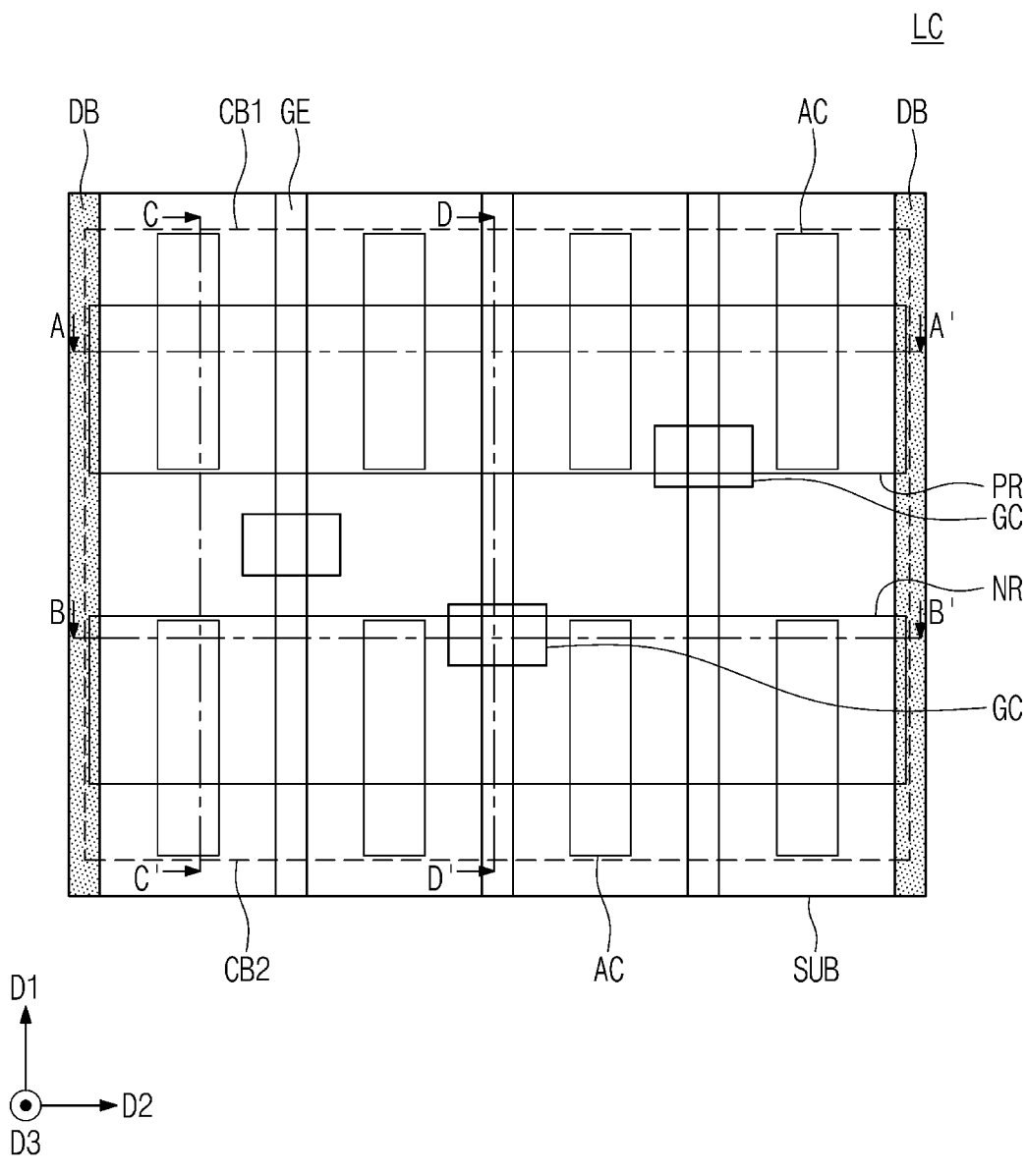
FIGS. 18 and 20 are plan views illustrating a method of fabricating a semiconductor device according to an embodiment of the inventive concept.
Figure 19A:
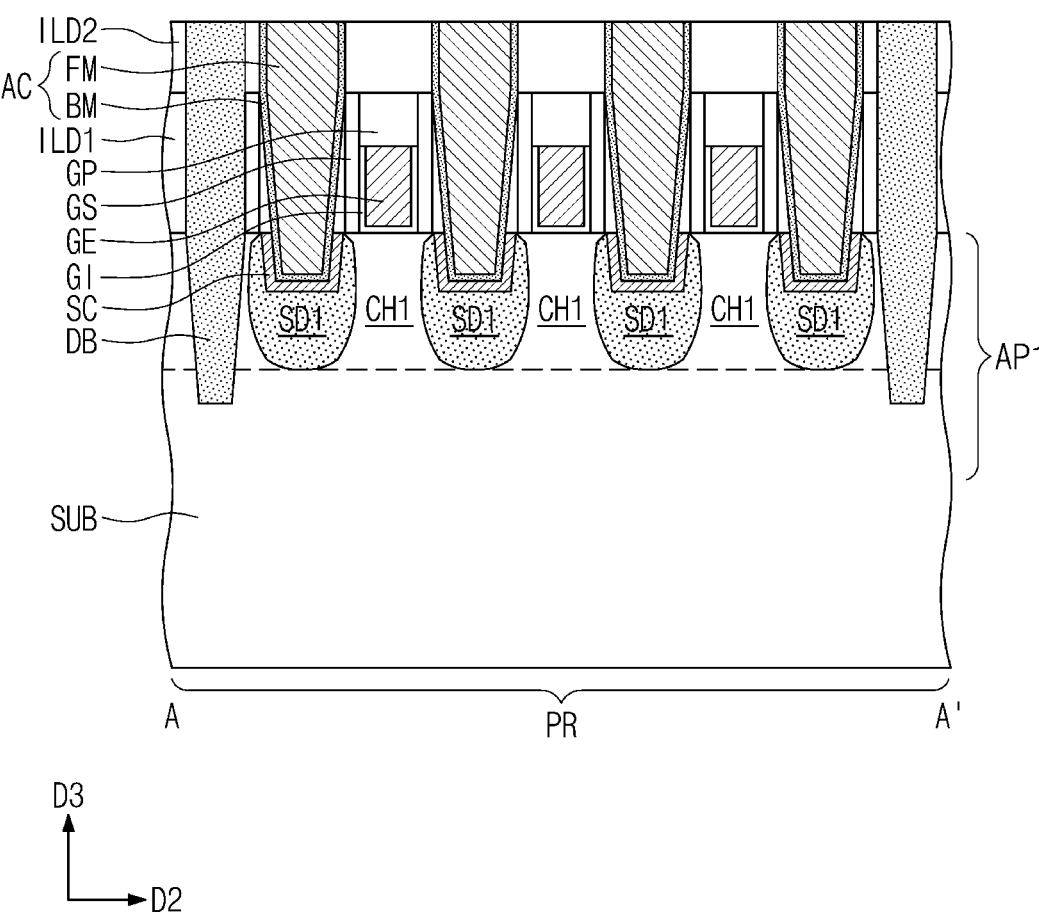
FIGS. 19A, 19B, 19C, and 19D are sectional views, which are respectively taken along lines A-A', B-B', C-C', and D-D' of FIG. 18.
Figure 19B:
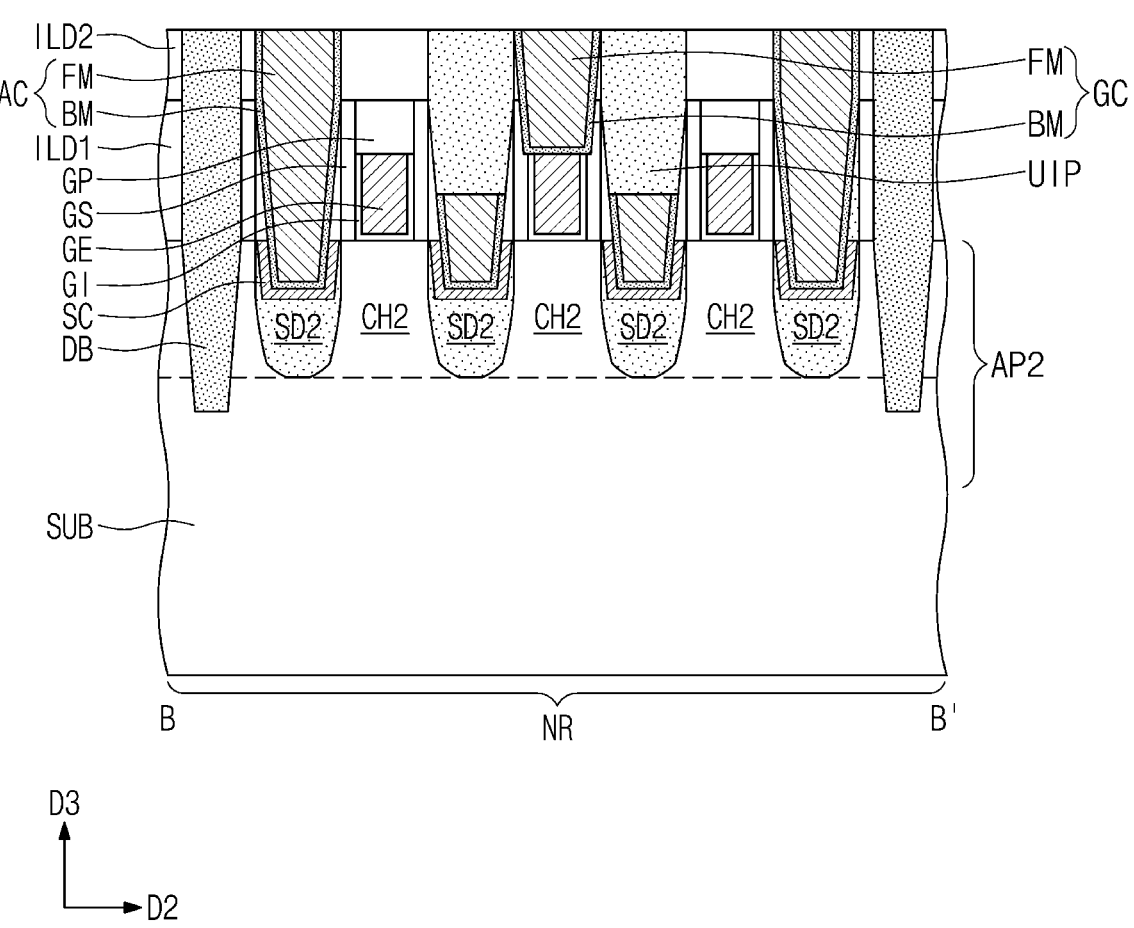
Figure 19C:
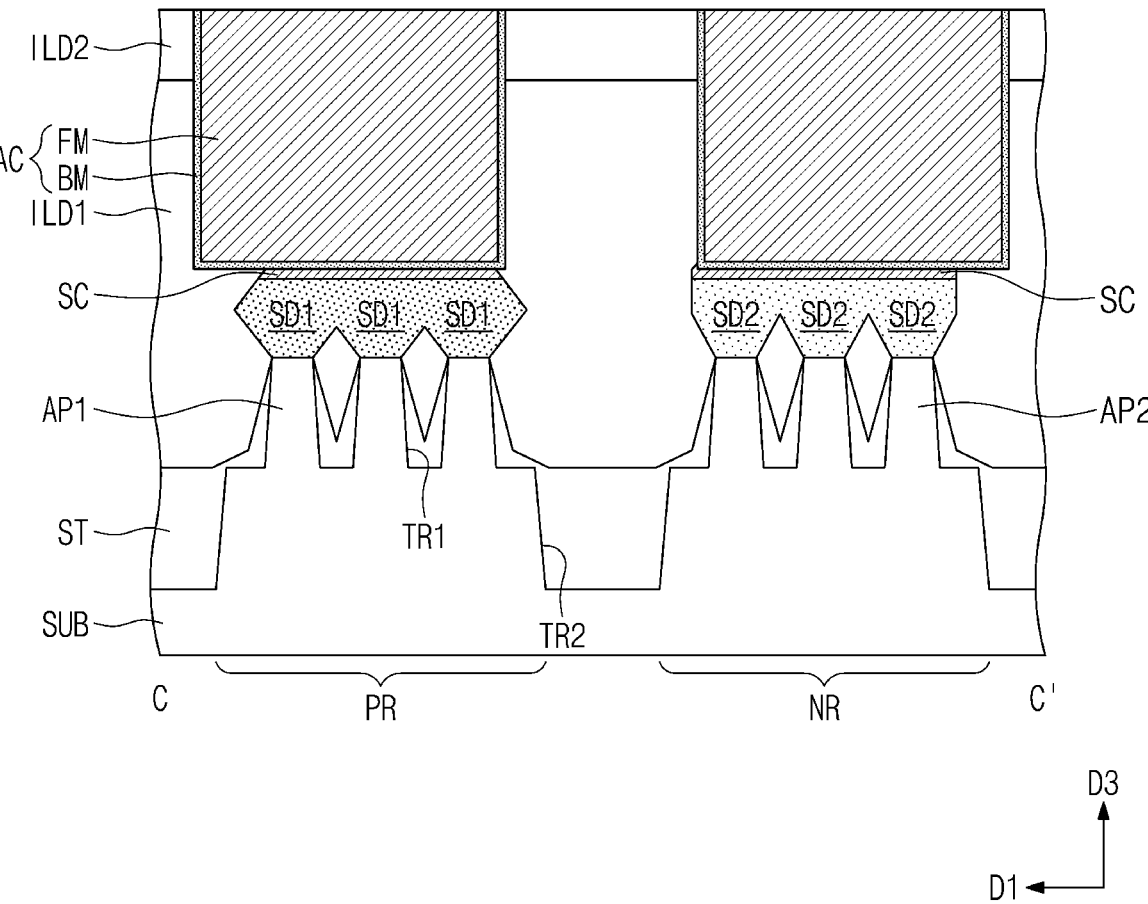
Figure 19D:
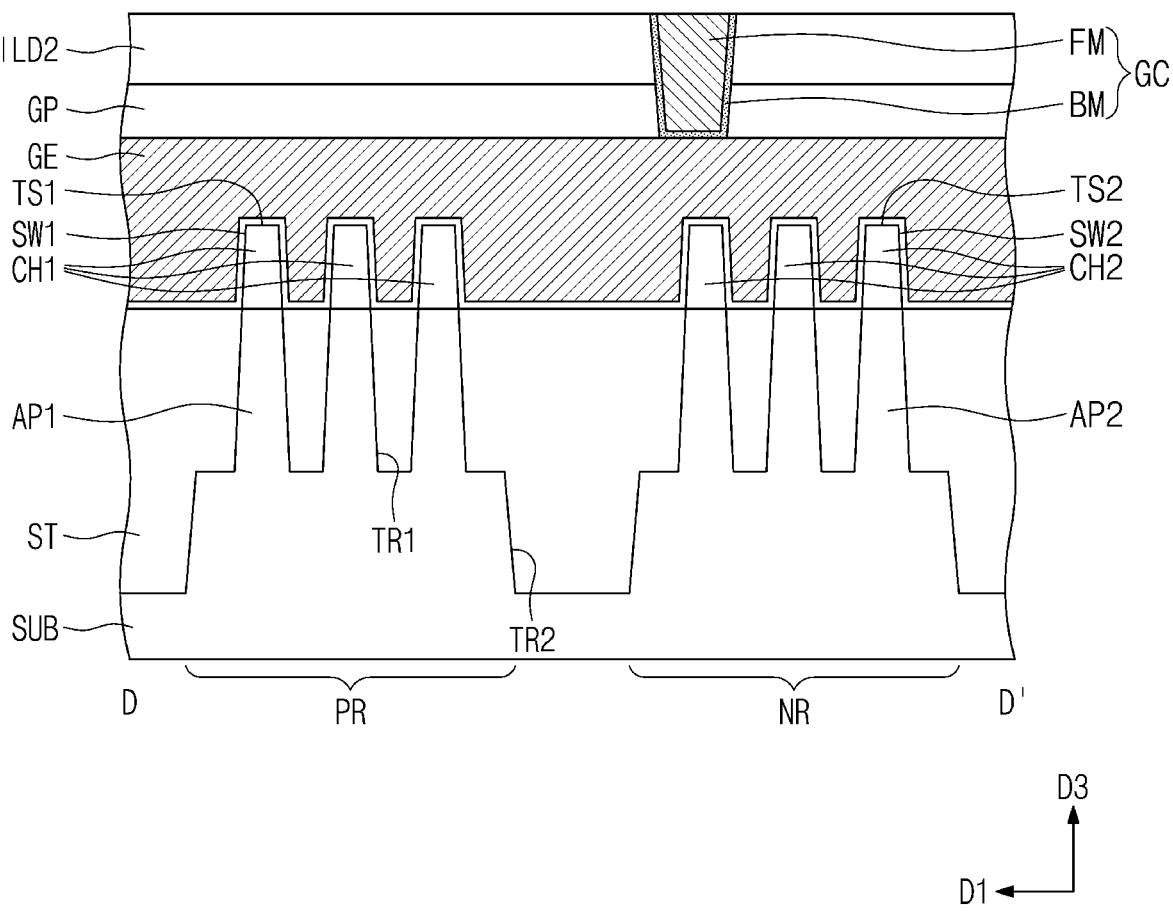
Figure 20:
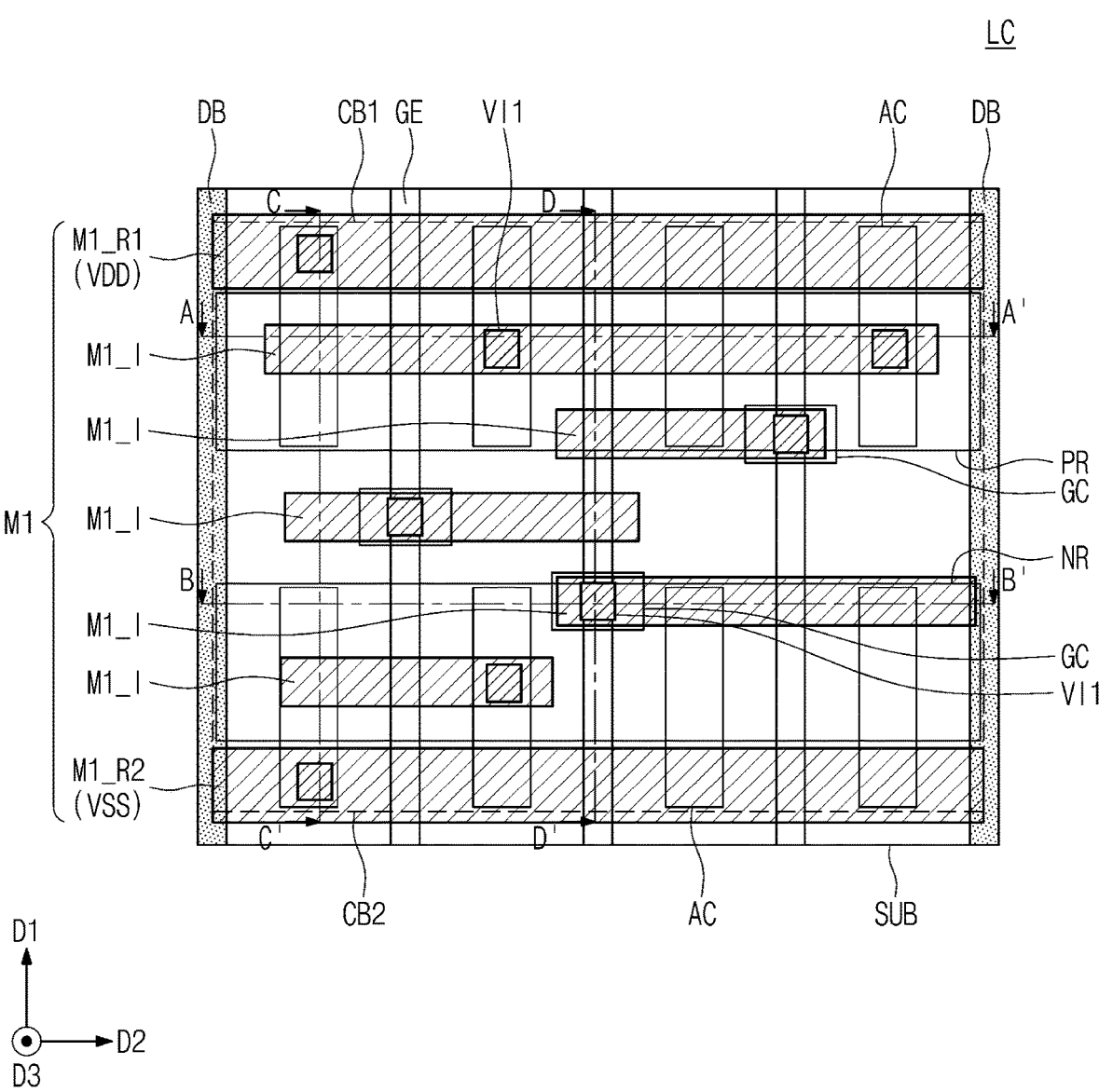
Figure 21A:
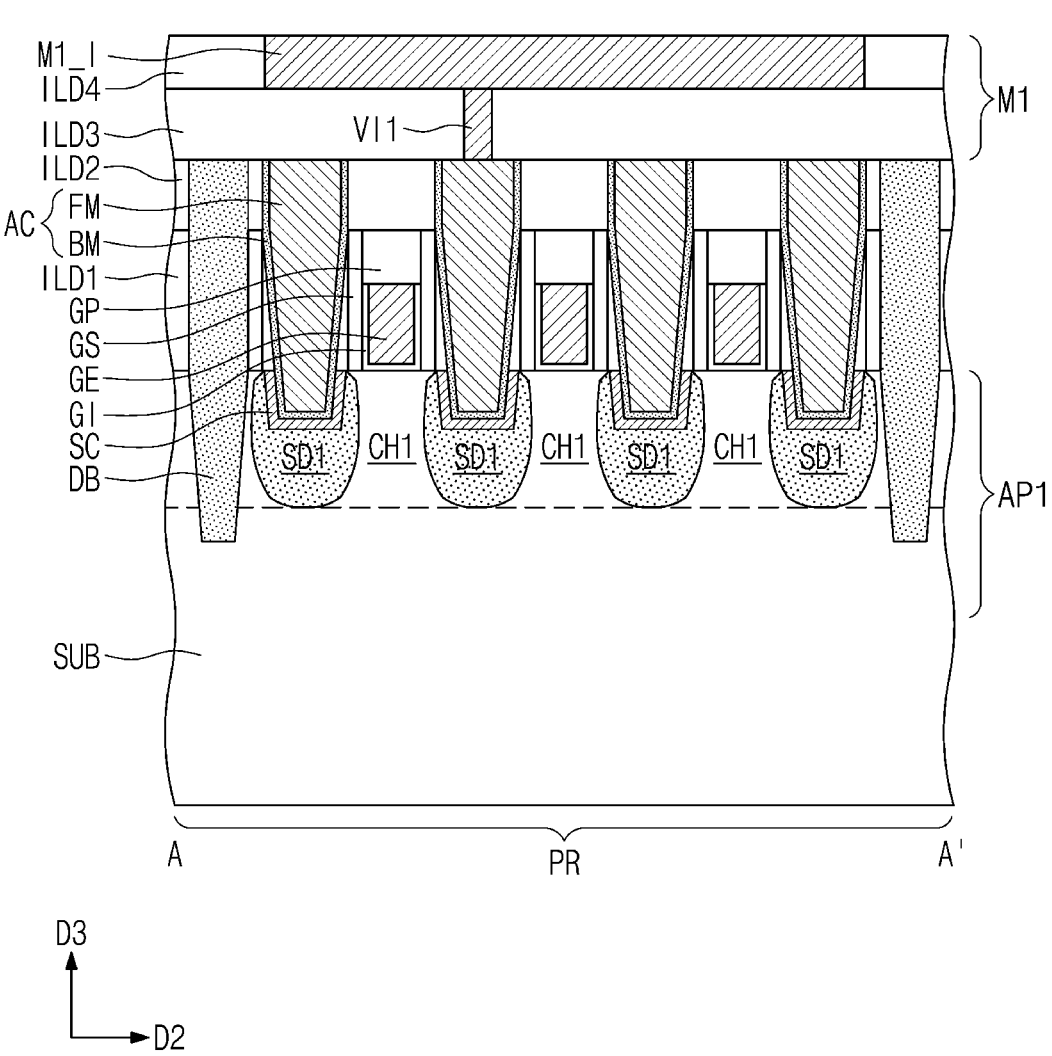
FIGS. 21A, 21B, 21C, and 21D are sectional views, which are respectively taken along lines A-A', B-B', C-C', and D-D' of FIG. 20.
Figure 21B:
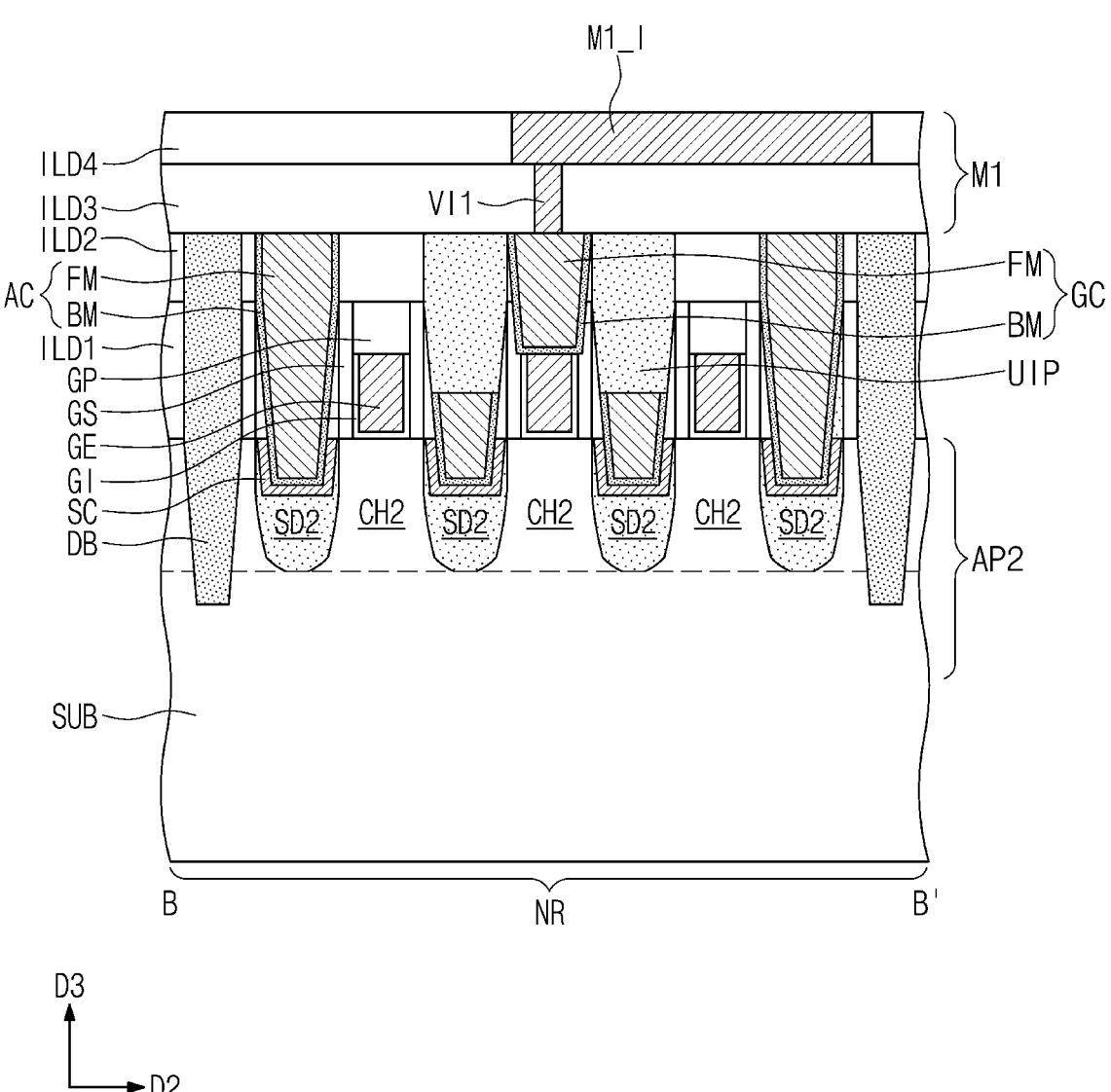
Figure 21C:
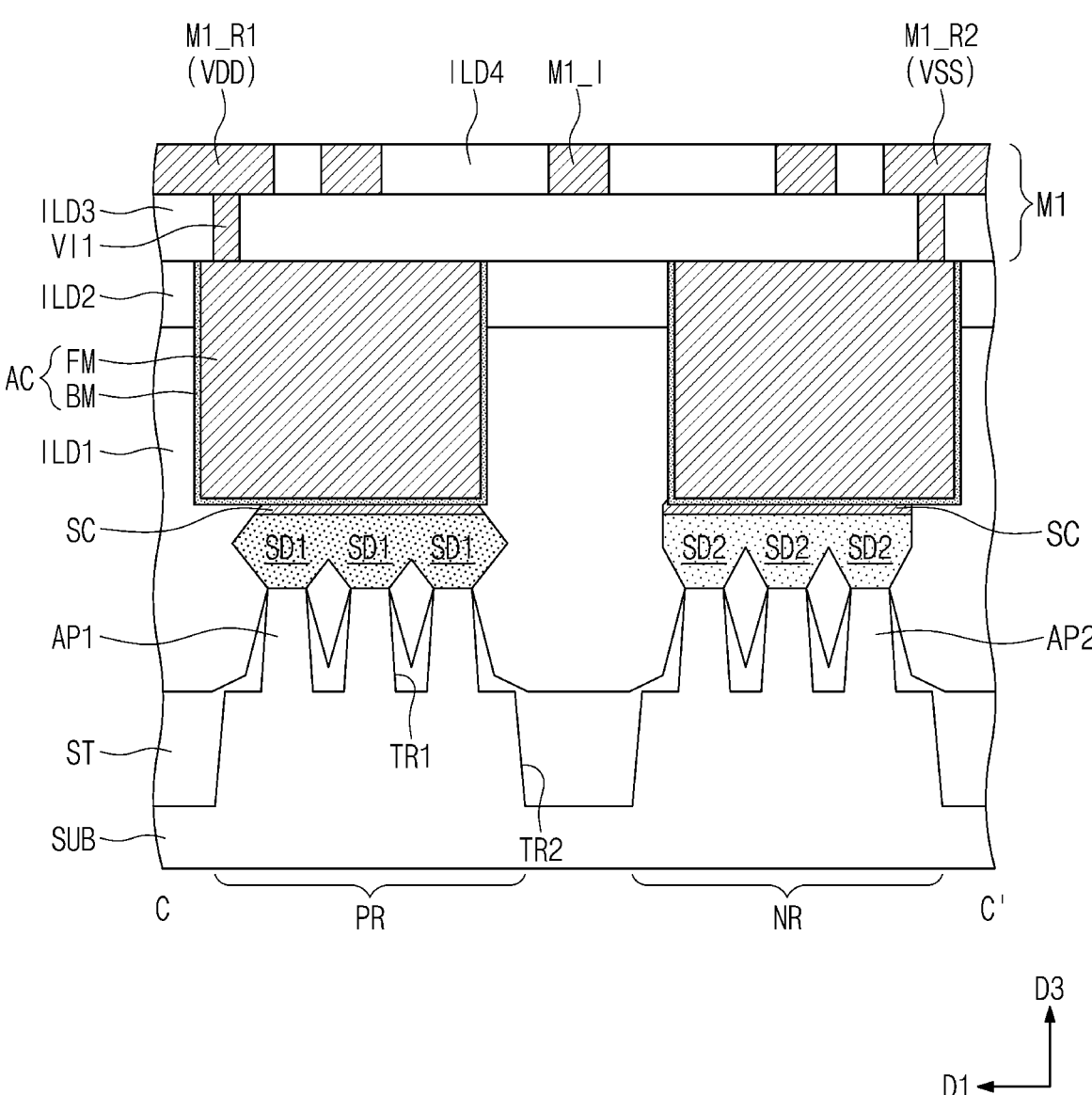
Figure 21D:
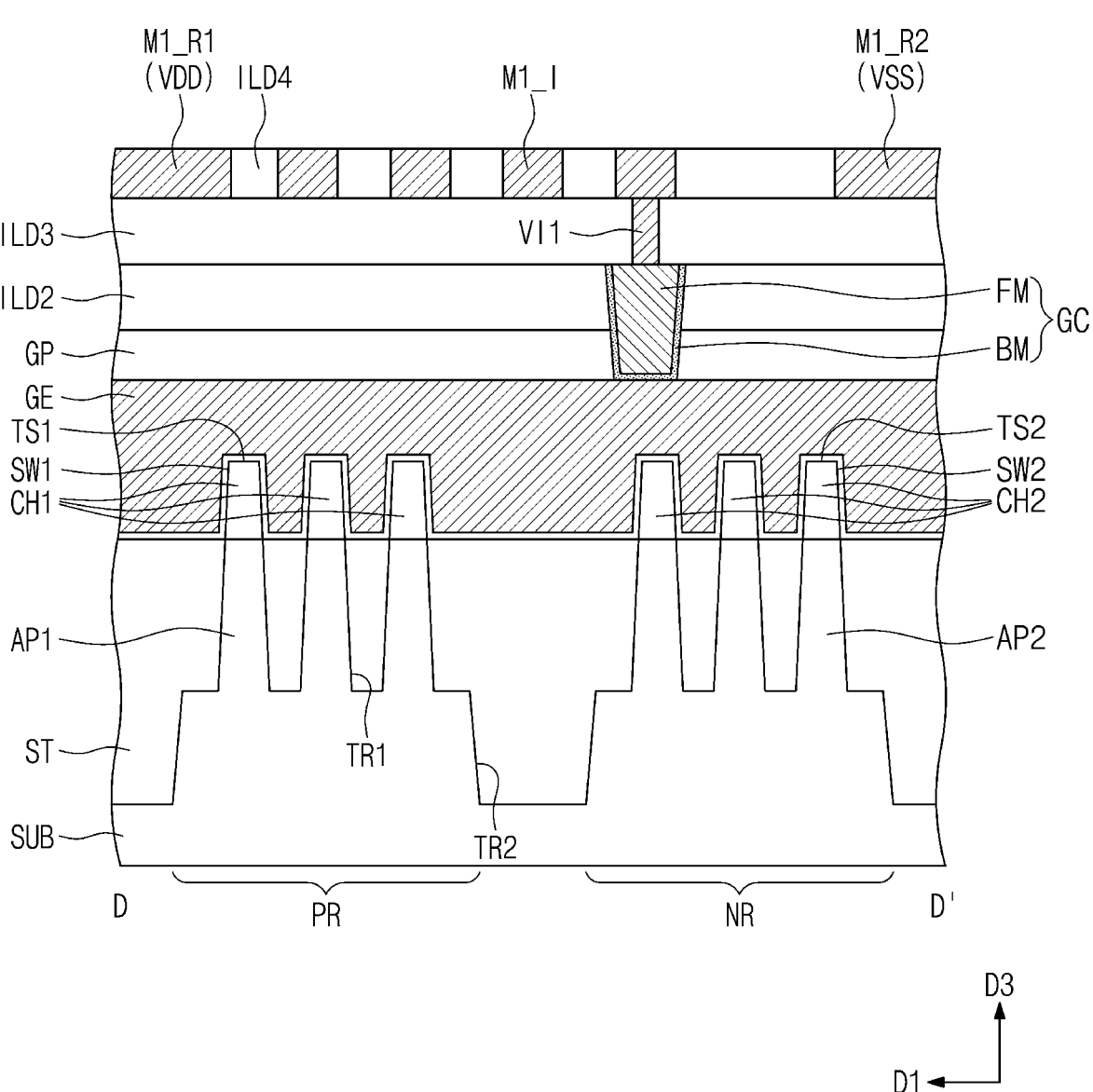

FIGS. 18 and 20 are plan views illustrating a method of fabricating a semiconductor device according to an embodiment of the inventive concept. FIGS. 19A, 19B, 19C, and 19D are sectional views, which are respectively taken along lines A-A', B-B', C-C', and D-D' of FIG. 18. FIGS. 21A, 21B, 21C, and 21D are sectional views, which are respectively taken along lines A-A', B-B', C-C', and D-D' of FIG. 20.

Referring to FIGS. 18 and 19A to 19D, a logic cell LC may be provided on the substrate SUB. Logic transistors constituting a logic circuit may be formed on the logic cell LC.

The substrate SUB may include a first active region PR and a second active region NR. In an embodiment, the first active region PR may be a PMOSFET region, and the second active region NR may be an NMOSFET region. The substrate SUB may be a semiconductor substrate that is formed of or includes silicon, germanium, silicon-germanium, a compound semiconductor material, or the like. As an example, the substrate SUB may be a silicon wafer.

The first and second active regions PR and NR may be defined by forming a second trench TR2 in an upper portion of the substrate SUB. The second trench TR2 may be located between the first and second active regions PR and NR. The first and second active regions PR and NR may be spaced apart from each other, in the first direction D1, with the second trench TR2 interposed therebetween. Each of the first and second active regions PR and NR may extend in a second direction D2 that is different from the first direction D1.

First active patterns AP1 and second active patterns AP2 may be formed on the first active region PR and the second active region NR, respectively. The first and second active patterns AP1 and AP2 may extend in the second direction D2 to be parallel to each other. The first and second active patterns AP1 and AP2 may be vertically protruding portions of the substrate SUB. A first trench TR1 may be formed between adjacent ones of the first active patterns AP1 and between adjacent ones of the second active patterns AP2. The first trench TR1 may be shallower than the second trench TR2.

A device isolation layer ST may be formed in (e.g., to fill) the first and second trenches TR1 and TR2. The device isolation layer ST may be formed of or include silicon oxide. Upper portions of the first and second active patterns AP1 and AP2 may protrude vertically above the device isolation layer ST (e.g., see FIG. 19D). Each of the upper portions of the first and second active patterns AP1 and AP2 may be a fin-shaped pattern. The device isolation layer ST may not cover the upper portions of the first and second active patterns AP1 and AP2. The device isolation layer ST may cover lower side surfaces of the first and second active patterns AP1 and AP2.

First source/drain regions SD1 may be formed on the upper portions of the first active patterns AP1. The first source/drain regions SD1 may be impurity regions of a first conductivity type (e.g., p-type). A first channel region CH1 may be interposed between each pair of the first source/drain regions SD1. Second source/drain regions SD2 may be formed on the upper portions of the second active patterns AP2. The second source/drain regions SD2 may be impurity regions of a second conductivity type (e.g., n-type). A second channel region CH2 may be interposed between each pair of the second source/drain regions SD2.

The first and second source/drain regions SD1 and SD2 may be formed by a selective epitaxial growth process. In other words, the first and second source/drain regions SD1 and SD2 may be epitaxial patterns.

The first source/drain regions SD1 may include a semi-conductor material (e.g., SiGe) having a lattice constant greater than that of the substrate SUB. Accordingly, the first source/drain regions SD1 may exert a compressive stress on the first channel regions CH1. As an example, the second source/drain regions SD2 may be formed of or include the same semiconductor material (e.g., Si) as the substrate SUB.

Gate electrodes GE may be formed to cross the first and second active patterns AP1 and AP2 and to extend in the first direction D1. The gate electrodes GE may be arranged with a constant pitch in the second direction D2. The gate electrodes GE may vertically overlap the first and second channel regions CH1 and CH2. Each of the gate electrodes GE may be formed to face a top surface and opposite side surfaces of each of the first and second channel regions CH1 and CH2.

Referring back to FIG. 19D, the gate electrode GE may be formed on a first top surface TS1 of the first channel region CH1 and on at least one first side surface SW1 of the first channel region CH1. The gate electrode GE may be formed on a second top surface TS2 of the second channel region CH2 and on at least one second side surface SW2 of the second channel region CH2. In other words, the transistor according to some embodiments may be a three-dimensional field-effect transistor (e.g., FinFET), in which the gate electrode GE is provided to three-dimensionally surround the channel regions CH1 and CH2.

Referring back to FIGS. 18 and 19A to 19D, a pair of gate spacers GS may be formed on opposite side surfaces of each of the gate electrodes GE. The gate spacers GS may extend along the gate electrodes GE or in the first direction D1. Top surfaces of the gate spacers GS may be higher than the top surfaces of the gate electrodes GE. The top surfaces of the gate spacers GS may be coplanar with a top surface of a first interlayer insulating layer ILD1, which will be described below. The gate spacers GS may be formed of or include at least one of silicon carbonitride (SiCN), silicon carbon oxynitride (SiCON), or silicon nitride (SiN). As another example, the gate spacers GS may have a multi-layered structure including at least two of SiCN, SiCON, or SiN.

A gate capping pattern GP may be formed on each of the gate electrodes GE. The gate capping pattern GP may extend along the gate electrode GE or in the first direction D1. The gate capping pattern GP may be formed of or include a material having an etch selectivity with respect to first and second interlayer insulating layers ILD1 and ILD2, which will be described below. For example, the gate capping patterns GP may be formed of or include at least one of silicon oxynitride (SiON), SiCN, SiCON, or SiN.

A gate insulating layer GI may be formed between the gate electrode GE and the first active pattern AP1 and between the gate electrode GE and the second active pattern AP2. The gate insulating layer GI may extend along a bottom surface of the gate electrode GE disposed thereon. As an example, the gate insulating layer GI may cover the first top surface TS1 and the first side surface SW1 of the first channel region CH1. The gate insulating layer GI may cover the second top surface TS2 and the second side surfaces SW2 of the second channel region CH2. The gate insulating layer GI may cover a top surface of the device isolation layer ST below the gate electrode GE (e.g., see FIG. 19D).

In an embodiment, the gate insulating layer GI may be formed of or include a high-k dielectric material having a dielectric constant higher than silicon oxide. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal pattern and a second metal pattern on the first metal pattern. The first metal pattern may be provided on the gate insulating layer GI and may be adjacent to the first and second channel regions CH1 and CH2. The first metal pattern may include a work function metal which adjusts a threshold voltage of the transistor. By adjusting a thickness and composition of the first metal pattern, it may be possible to realize a transistor having a desired threshold voltage.

The first metal pattern may include a metal nitride layer. For example, the first metal pattern may include at least one metallic material, which is selected from the group consisting of titanium (Ti), tantalum (Ta), aluminum (Al), tungsten (W), and molybdenum (Mo), and nitrogen (N). The first metal pattern may further include carbon (C). The first metal pattern may include a plurality of work function metal layers, which are stacked.

The second metal pattern may include a metallic material whose resistance is lower than the first metal pattern. For example, the second metal pattern may include at least one metal selected from the group consisting of tungsten (W), aluminum (Al), titanium (Ti), and tantalum (Ta).

A first interlayer insulating layer ILD1 may be formed on the substrate SUB. The first interlayer insulating layer ILD1 may be formed to cover the gate spacers GS and the first and second source/drain regions SD1 and SD2. A top surface of the first interlayer insulating layer ILD1 may be substantially coplanar with the top surfaces of the gate capping patterns GP and the top surfaces of the gate spacers GS. A second interlayer insulating layer ILD2 may be formed on the first interlayer insulating layer ILD1 to cover the gate capping patterns GP.

A pair of division structures DB, which are opposite to each other in the second direction D2, may be formed at opposite sides of the logic cell LC. The division structure DB may extend in the first direction D1 and parallel to the gate electrodes GE. The division structure DB may be provided to penetrate the first and second interlayer insulating layers ILD1 and ILD2 and to extend into the first and second active patterns AP1 and AP2. The division structure DB may penetrate an upper portion of each of the first and second active patterns AP1 and AP2. The division structure DB may separate the first and second active regions PR and NR of the logic cell LC from the active region of another logic cell adjacent thereto.

Active contacts AC may be formed to penetrate the first and second interlayer insulating layers ILD1 and ILD2 and to be electrically connected to the first and second source/drain regions SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of the side surface of the gate spacer GS. Although not shown, the active contact AC may be provided to cover a portion of the top surface of the gate capping pattern GP.

Silicide patterns SC may be formed between the active contact AC and the first source/drain region SD1 and between the active contact AC and the second source/drain region SD2. The active contact AC may be electrically connected to the source/drain region SD1 or SD2 through the silicide pattern SC. The silicide pattern SC may be formed of or include at least one of various metal silicide materials (e.g., titanium silicide, tantalum silicide, tungsten silicide, nickel silicide, or cobalt silicide).

A gate contact GC may be formed to penetrate the second interlayer insulating layer ILD2 and the gate capping pattern GP and to be electrically connected to the gate electrode GE. As an example, referring to FIG. 19B, an upper insulating pattern UIP may be formed on each active contact AC adjacent to the gate contact GC. Accordingly, it may be possible to inhibit/prevent the gate contact GC from being in contact with the active contact AC adjacent thereto and thereby inhibit/prevent a short circuit issue from occurring.

Each of the active and gate contacts AC and GC may include a conductive pattern FM and a barrier pattern BM enclosing the conductive pattern FM. The conductive pattern FM may be formed of or include at least one of various metallic materials (e.g., aluminum, copper, tungsten, molybdenum, or cobalt). The barrier pattern BM may cover side and bottom surfaces of the conductive pattern FM. The barrier pattern BM may include a metal layer and a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

In an embodiment, the formation of the active and gate contacts AC and GC may include patterning the interlayer insulating layers ILD1 and ILD2 to form contact holes and filling the contact holes with the barrier pattern BM and the conductive pattern FM. The patterning process for forming the contact holes may be performed using the photolithography process previously described with reference to FIGS. 7 and 8. A photomask, which is used to form the active and gate contacts AC and GC (i.e., the contact holes), may be manufactured through the OPC step (in S30) previously described with reference to FIGS. 9 to 14.

Referring to FIGS. 20 and 21A to 21D, a third interlayer insulating layer ILD3 may be formed on the second interlayer insulating layer ILD2. First vias VI1 may be formed in the third interlayer insulating layer ILD3. A fourth interlayer insulating layer ILD4 may be formed on the third interlayer insulating layer ILD3. Interconnection lines M1_R1, M1_R2, and M1_I may be formed in the fourth interlayer insulating layer ILD4. The interconnection lines M1_R1, M1_R2, and M1_I may include a first power line M1_R1, a second power line M1_R2, and lower interconnection lines M1_I.

Referring back to FIG. 20, each of the first and second power lines M1_R1 and M1_R2 may extend in the second direction D2 to cross the logic cell LC. The lower interconnection lines M1_I may be disposed between the first and second lower power lines M1_R1 and M1_R2. The lower interconnection lines M1_I may be a line- or bar-shaped pattern extending in the second direction D2.

The interconnection lines M1_R1, M1_R2, and M1_I and the first vias VI1 thereunder may constitute a first metal layer M1. The first via VI1 may be interposed between the interconnection line and the active or gate contact AC or GC to electrically connect them to each other. Although not shown, additional metal layers may be formed on the first metal layer M1.

In an embodiment, the patterning process for forming the interconnection lines M1_R1, M1_R2, and M1_I may be performed using the photolithography process previously described with reference to FIGS. 7 and 8. A photomask, which is used to form the interconnection lines M1_R1, M1_R2, and M1_I, may be manufactured through the OPC step (in S30) previously described with reference to FIGS. 9 to 14.

In an OPC method according to an embodiment of the inventive concept, during an OPC step, a segment, which is a target object in a biasing step, may be divided into a plurality of sub-segments. By biasing the sub-segments, it may be possible to reduce a target error between a simulation contour and a target pattern and thereby to improve accuracy of the OPC step.

In an OPC method according to an embodiment of the inventive concept, it may be possible to modify a correction pattern of a polygonal shape to a fine correction pattern of a curvilinear shape in a fast and efficient manner. Accordingly, it may be possible to provide an optical proximity correction (OPC) method that can be performed in a highly accurate manner, without violating a mask rule. By using the OPC method, it may be possible to reduce a failure in a process of fabricating a semiconductor device and thereby to improve reliability of the fabrication process.

While example embodiments of the inventive concept have been particularly shown and described, it will be understood by one of ordinary skill in the art that variations in form and detail may be made therein without departing from the scope of the attached claims.

What is claimed is:

1. A method of fabricating a semiconductor device, comprising:
   performing an optical proximity correction (OPC) step on a design pattern of a layout; and
   forming a photoresist pattern on a substrate using a photomask manufactured based on the layout corrected,
   wherein the performing of the OPC step comprises:
   generating a target pattern for the design pattern;
   dividing the design pattern into a plurality of segments;
   biasing the segments to generate a correction pattern;
   dividing a first segment, which is one of the segments, into a plurality of sub-segments; and
   biasing the sub-segments to generate a fine correction pattern.

2. The method of claim 1, wherein the biasing of the segments and the sub-segments is performed until a simulation contour of the fine correction pattern corresponds to the target pattern.

3. The method of claim 1, wherein the performing of the OPC step further comprises:
   measuring a target error between a simulation contour of the fine correction pattern and the target pattern; and
   examining whether the target error is within an error tolerance range.

4. The method of claim 3, wherein the performing of the OPC step further comprise dividing at least one of the sub-segments into smaller sub-segments until the target error is within the error tolerance range.

5. The method of claim 1, wherein a length of the first segment of the correction pattern is larger than a length of the first segment of the design pattern, before the biasing.

6. The method of claim 1, wherein the dividing of the first segment into the sub-segments comprises defining at least one dissection point on the first segment.

7. The method of claim 6, wherein the at least one dissection point is generated when a length of the first segment is larger than a specific length.

8. The method of claim 6, wherein the at least one dissection point is generated at a point, at which a simulation contour of the correction pattern has a ripple.

9. The method of claim 8, wherein the generating of the at least one dissection point further comprises:

dividing the ripple into a plurality of pixels;

calculating an intensity value of light from each of the pixels; and choosing adjacent ones of the pixels such that a difference between the intensity values is maximized, wherein the dissection point corresponds to a point between the adjacent ones of the pixels.

10. The method of claim 1, further comprising:

forming transistors on the substrate;

forming an interlayer insulating layer on the transistors; and forming interconnection lines in the interlayer insulating layer, wherein the photoresist pattern defines a mask for forming the interconnection lines.

11. A method of fabricating a semiconductor device, comprising:

performing an optical proximity correction (OPC) step on a design pattern of a layout; and forming a photoresist pattern on a substrate, using a photomask manufactured based on the layout corrected, wherein the performing of the OPC step comprises:

generating a target pattern for the design pattern;

dividing the design pattern into a plurality of segments; and generating a fine correction pattern such that a simulation contour of the fine correction pattern corresponds to the target pattern, wherein the number of the segments of the fine correction pattern is increased to a value greater than the number of the segments of the design pattern, during the OPC step.

12. The method of claim 11, wherein the generating of the fine correction pattern comprises:

biasing the segments to generate a correction pattern;

dividing a first segment, which is one of the segments, into a plurality of sub-segments; and biasing the sub-segments.

13. The method of claim 11, wherein a center line is defined to pass through a center of the fine correction pattern, and the number of the segments adjacent to a side of the center line is different from the number of the segments adjacent to an opposite side of the center line.

14. The method of claim 11, wherein, during the OPC step, the number of the segments is continually increased until the simulation contour corresponds to the target pattern.

15. The method of claim 11, wherein the performing of the OPC step further comprises:

measuring a target error between a simulation contour of the fine correction pattern and the target pattern; and examining whether the target error is within an error tolerance range.

16. A method of fabricating a semiconductor device, comprising:

performing an optical proximity correction (OPC) step on a design pattern of a layout; and forming a photoresist pattern on a substrate, using a photomask manufactured based on the layout corrected, wherein the performing of the OPC step comprises:

generating a target pattern for the design pattern;

dividing the design pattern into a plurality of segments;

biasing a first segment, which is one of the segments, such that a first simulation contour corresponding to the first segment is adjacent to the target pattern;

dividing a ripple of the first simulation contour into a plurality of pixels;

calculating an intensity value of light of each of the pixels;

choosing adjacent ones of the pixels such that a difference between the intensity values is maximized; and choosing a point between the adjacent ones of the pixels as a dissection point to divide the first segment into a first sub-segment and a second sub-segment.

17. The method of claim 16, wherein the performing of the OPC step further comprises biasing the first and second sub-segments to generate a fine correction pattern.

18. The method of claim 17, wherein the biasing of the first and second sub-segments is repeated until a second simulation contour of the fine correction pattern corresponds to the target pattern.

19. The method of claim 17, wherein the performing of the OPC step further comprises:

measuring a target error between a second simulation contour of the fine correction pattern and the target pattern; and examining whether the target error is within an error tolerance range.

20. The method of claim 19, wherein the performing of the OPC step further comprises dividing at least one of the first and second sub-segments into smaller sub-segments until the target error is within the error tolerance range.

* * * * *